US005381137A

United States Patent [19]

Ghaem et al.

[11] Patent Number: 5,381,137

[45] Date of Patent: Jan. 10, 1995

[54] RF TAGGING SYSTEM AND RF TAGS AND METHOD

[75] Inventors: Sanjar Ghaem, Palatine; Rudyard L. Istvan, Winnetka; George L. Lauro, Lake Zurich, all of Ill.

[73] Assignee: Motorola, Inc., Schaumburg, Ill.

[21] Appl. No.: 966,653

[22] Filed: Oct. 26, 1992

[51] Int. Cl.[6] ..................... G08B 13/187; H05K 3/02; H05K 3/12

[52] U.S. Cl. ..................................... 340/572; 29/846; 29/847; 336/200

[58] Field of Search .................. 340/572; 29/847, 846; 336/200

[56] References Cited

U.S. PATENT DOCUMENTS

| | | | |
|---|---|---|---|
| 3,671,721 | 6/1972 | Hunn et al. | 235/439 |
| 3,913,219 | 10/1975 | Lichtblau | 29/592.1 |
| 4,023,167 | 5/1977 | Wahlstrom | 342/42 |
| 4,288,689 | 9/1981 | Lemelson et al. | 235/435 |
| 4,302,846 | 11/1981 | Stephen et al. | 455/19 |
| 4,303,910 | 12/1981 | McCann | 340/572 |
| 4,494,100 | 1/1985 | Stengel et al. | 336/200 |
| 4,531,117 | 7/1985 | Nourse et al. | 340/572 |
| 4,560,445 | 12/1985 | Hoover et al. | 205/126 |
| 4,647,917 | 3/1987 | Anderson et al. | 340/572 |
| 4,649,497 | 3/1987 | Carlson et al. | 29/846 |
| 4,752,680 | 6/1988 | Larsson | 235/492 |
| 4,802,944 | 2/1989 | Benge | 156/247 |
| 4,935,093 | 6/1990 | Reeb | 156/630 |
| 4,970,495 | 11/1991 | Matsumoto et al. | 340/568 |
| 4,985,288 | 1/1991 | Matsumoto et al. | 428/40 |
| 5,019,815 | 5/1991 | Lemelson et al. | 340/933 |
| 5,119,070 | 6/1992 | Matsumoto et al. | 340/572 |

FOREIGN PATENT DOCUMENTS

| | | |
|---|---|---|
| 2246492A | 1/1992 | United Kingdom . |
| 86/02186 | 4/1986 | WIPO . |
| 86/04172 | 7/1986 | WIPO . |

*Primary Examiner*—Glen Swann III
*Attorney, Agent, or Firm*—Phillip H. Melamed

[57] ABSTRACT

RF tagging system (10) has a plurality of resonant circuits (13) on a tag (12). When the tag (12) enters a detection zone (14), the system determines the resonant frequency of each of the resonant circuits (13) and produces a corresponding code. Preferably, resonant frequency detection is implemented by simultaneously radiating signals at each possible resonant frequencies for the tag circuits (13). The system is useful for coding any articles such as baggage or production inventory. Preferably, the radiated signals are phase shifted during the detection process, and signals received by receiver antennas, besides transmitter signals, may be monitored to improve the reliability of detecting the resonant circuits (13). Also, a preferred step adjustment configuration for capacitive metalizations (106, 110) of the resonant circuits is described. For radiating signals into the detection zone (14), focused beam antennas (201) may be used such that each resonant circuit location on the tag can be separately monitored. Also, an apparatus (300) for producing customized resonant circuit tags in accordance with a specified input code is described.

41 Claims, 9 Drawing Sheets

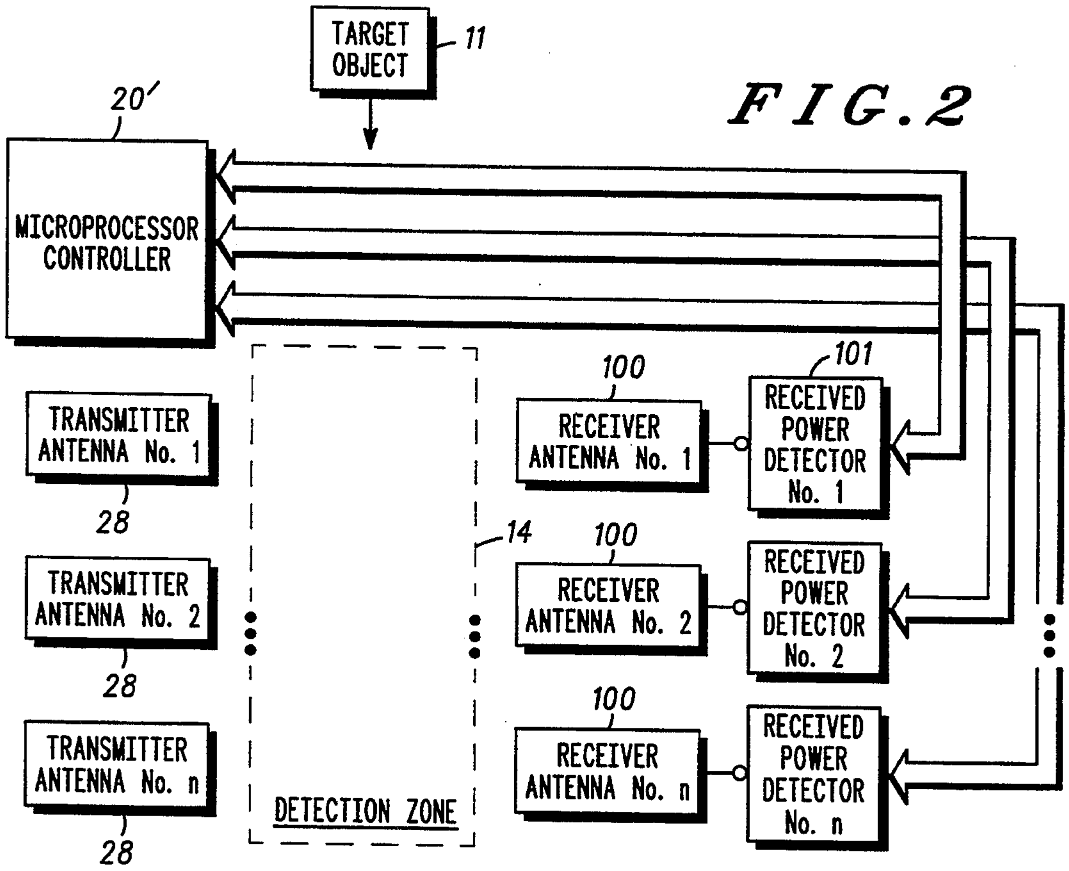
FIG. 2
FIG. 5
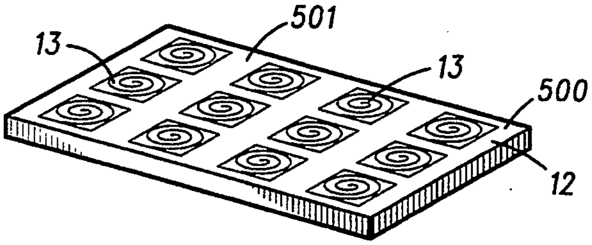
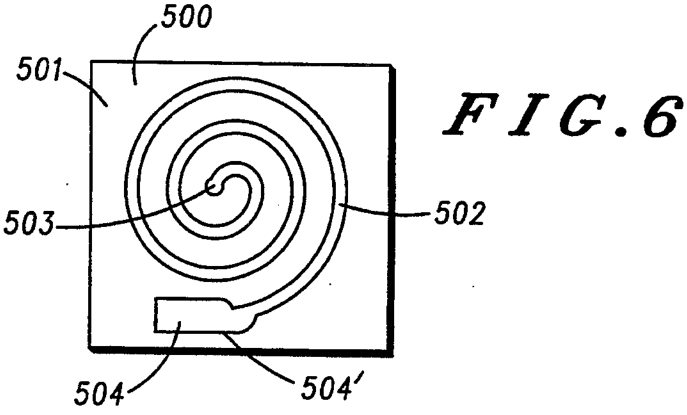
FIG. 6

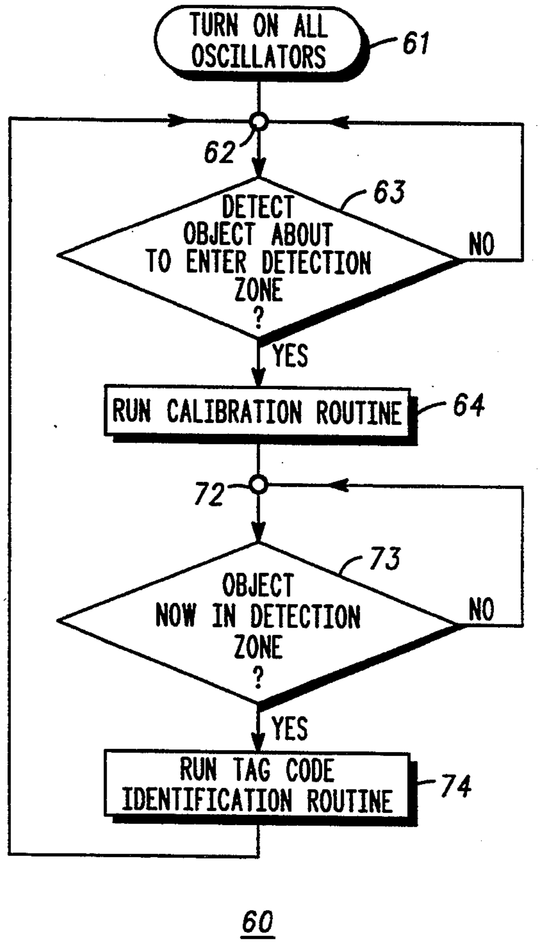
FIG.9
FIG.10
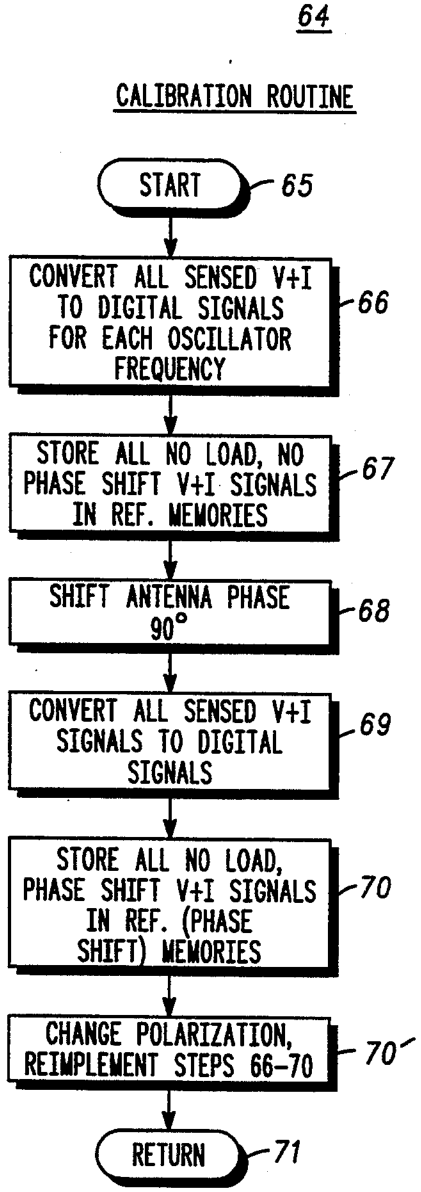

TAG CODE IDENTIFICATION ROUTINE

74

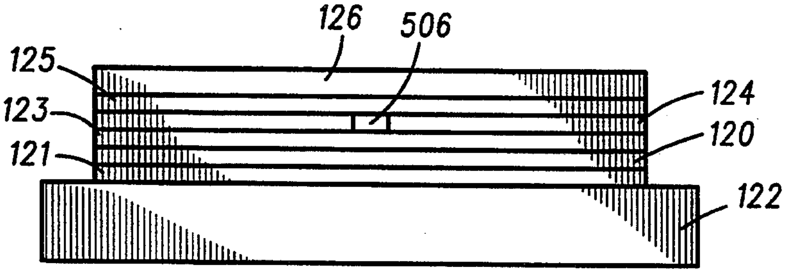
TAG RESONANT CIRCUIT LAYERS
FIG.12
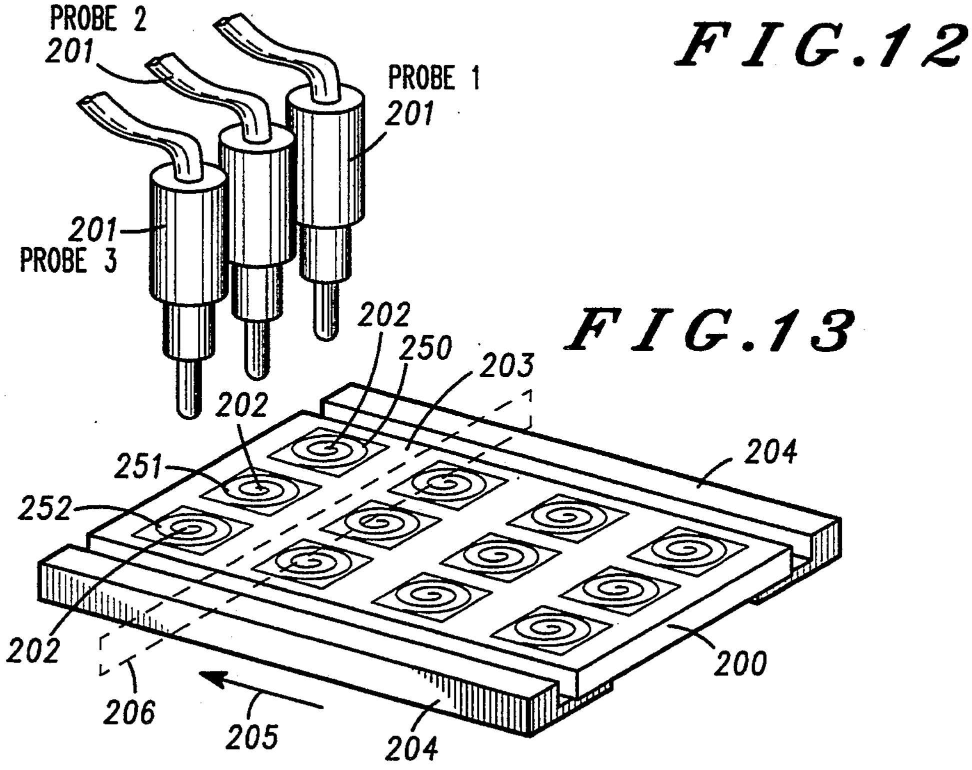
FIG.13
FIG.14
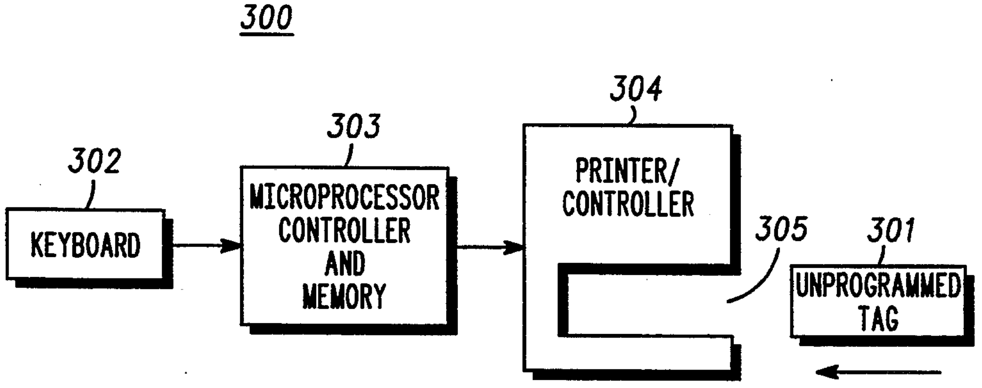

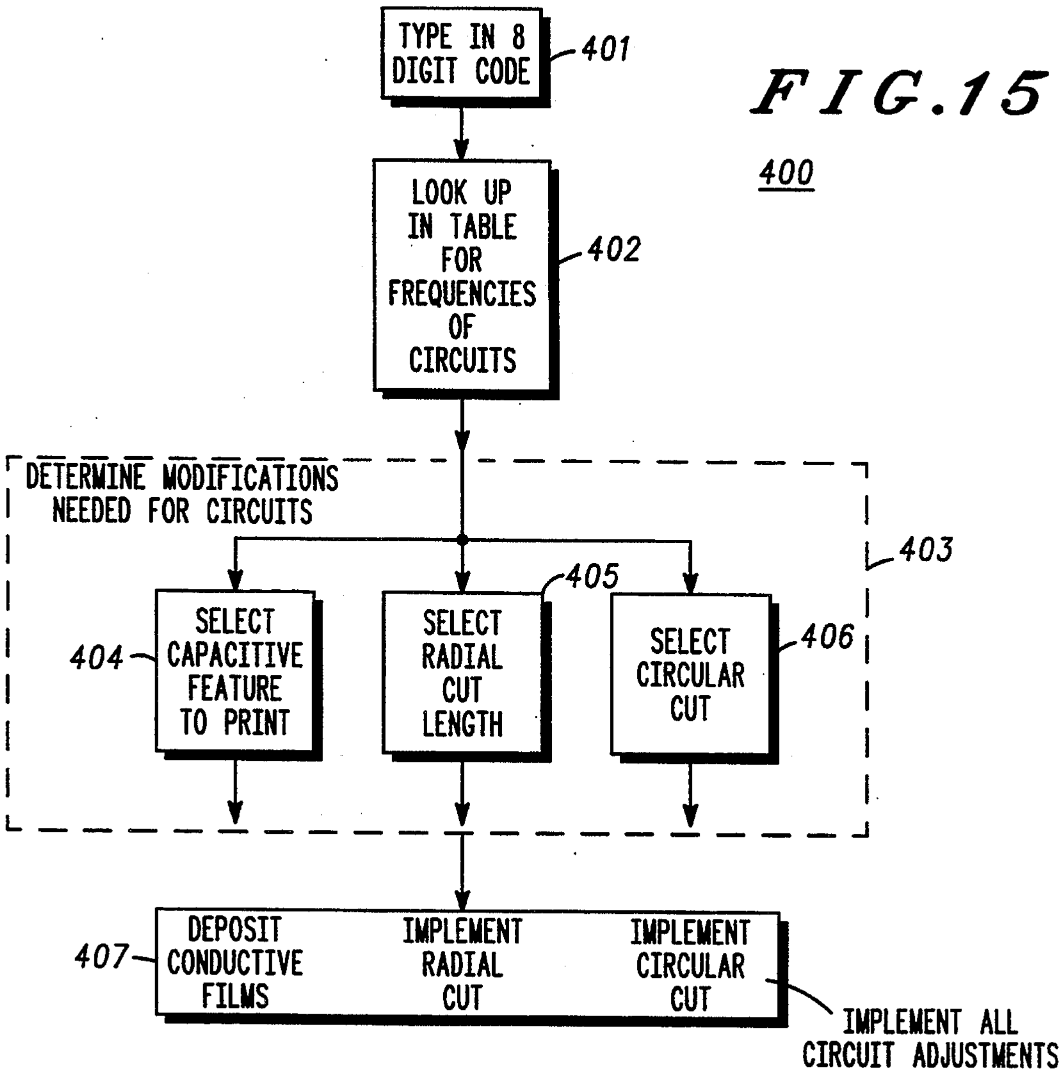
FIG. 15
FIG. 16
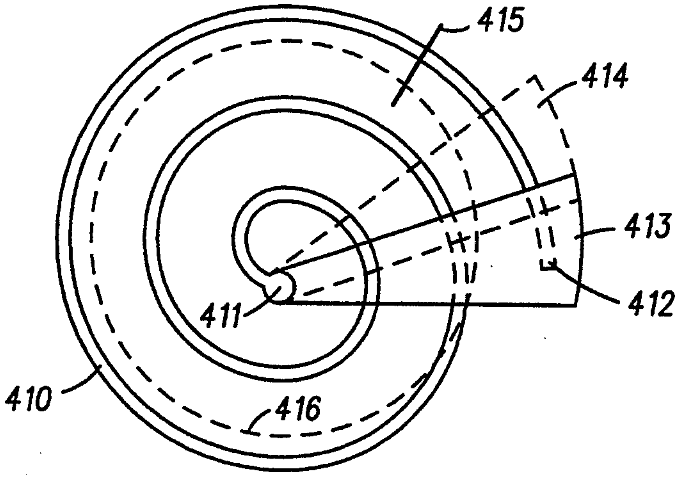

RF TAGGING SYSTEM AND RF TAGS AND METHOD

FIELD OF INVENTION

The present invention generally relates to the field of RF tagging systems, and RF tags, in which the presence of resonant circuits resonant at specific known frequencies in a detection zone is used to generate a code determined in accordance with which resonant circuits are detected as being in the detection zone. More particularly, the present invention is directed to the fields of an improved RF tagging system which more accurately and/or rapidly determines when circuits resonant at specific frequencies are in the detection zone, a preferred configuration for metalizations which form a resonant circuit for an RF tag, improved RF tag construction and methods, a system configuration which allows individual monitoring of specific tag areas on which a single resonant circuit may be provided, and an apparatus which allows producing customized resonant tags in response to a specified input code.

BACKGROUND OF THE INVENTION

Prior art systems are known in which the existence of a single resonant circuit in a detection field or zone is utilized as an anti-theft type apparatus. Essentially, if an article having a single resonant frequency tag passes through a detection zone, an alarm is generated which indicates the unauthorized presence of store goods in the detection zone. Such resonant circuits have been constructed in accordance with standard printed circuit board techniques. These systems do not identify which specific goods are in the detection zone since only a single code is used for tagging or identifying all tagged goods in a store inventory.

Some prior RF tagging systems have provided multiple different tuned (resonant) circuits on a tag so as to specifically identify the goods to which the tag is attached or the destination to which those goods should be directed. Such systems have been proposed for parcel or other article delivery systems wherein resonant circuits are utilized to provide a destination or sender code rather than printed bar codes.

The use of resonant circuit tagging is advantageous in that it is not subject to problems such as dirt obscuring a portion of a printed bar code and causing an error in determining the code associated with the article. Also, exact alignment of the tag with the detection system may not be required in RF tagging systems, since generally it is desired only to detect the presence of the resonant circuits somewhere in a broad detection zone. This can be achieved without precise alignment between the resonant circuit, the detection zone and the detection apparatus. However, prior systems utilizing multiple tuned circuit detection contemplate sequentially generating or gating each of the different resonant frequency signals to a transmitter antenna, and then waiting for reflected energy from each of the tuned circuits to be detected. Some frequency tagging systems look for absorption of RF energy by a resonant circuit during the transmission of each test frequency signal.

Generally, each different resonant frequency in a multiple frequency system is provided by a master oscillator circuit whose output is essentially swept or stepped to sequentially provide each desired output frequency. In all of these systems the result is essentially a slow detection system since the systems sequentially radiate each of the different frequencies. Rapid detection is achieved only if there are a few different frequencies involved. However, for complex coding which may require the use of up to 20 or more different frequencies, the overall system detection response is slow and may result in errors unless the tag throughput through the detection zone is intentionally slowed down. Since a major purpose of providing an RF tagging system is to improve the speed at which goods are handled by rapidly identifying the codes associated with the goods, this is undesirable.

Some prior RF tagging systems contemplate printing a large number of different resonant frequency circuits on a tag and then creating different codes by the selective adjustment of some of these resonant circuits. These systems have recognized that it may be necessary to adjust the resonant frequency provided for each circuit and such adjustment is generally contemplated as occurring by selective removal of metalizations forming the resonant circuit. Some systems have recognized that step adjustments of the resonant frequency of such tuned circuits is desirable and this has been implemented by punching holes of predetermined diameters in capacitive elements of the resonant circuit to thereby reduce capacitance and increase the frequency of the resonant circuit. Such known prior techniques are not readily adaptable to mass production of customized resonant frequency codes by a post factory manufacturing operation. Many times, the actual code to be utilized will not be known until immediately prior to attaching a tag or label to an article. In such a situation, an improved technique of adjusting the resonant frequencies of tuned circuits on a tag is desirable such that the process can be readily automated if desired or implemented even manually with a minimum amount of skill and precision required of the operator.

When it is possible to accurately control the orientation between the resonant multiple frequency tag and the detection system, some prior systems have noted that fewer different resonant frequencies may be needed to produce the desired end coding result. However, these prior systems accomplish this result by just limiting the number of circuits in the detection zone so that the zone can only accommodate a few different tuned circuits at one time. This has the undesirable effect of effectively requiring wide spacing between tuned circuits on a tag and therefore undesirably increasing the size of the tag on which the tuned circuits are provided.

Prior RF tags typically use etching to create desired metalization patterns, but this may not be readily adapted to mass production of such tags in a cost effective manner.

SUMMARY OF THE INVENTION

An improved RF tagging system is described herein. The system includes, as a significant feature, the simultaneous radiation of RF energy at a plurality of different frequencies (which can be implemented by radiating a plurality of different oscillator signals) in order to detect each of a plurality of different frequency resonant circuits which may be provided on a tag. Then a code signal indicative of which resonant frequencies for the tag resonant circuits were detected is provided. The above feature results in a much faster detection of which resonant frequency circuits are provided on a tag in a detection zone. In accordance with another feature of the present invention, an advantageous configuration for step frequency adjusting the resonant frequencies of resonant circuits on a tag is described. Additionally, an RF tagging system is described which utilizes focused narrow radiation beams for detection of individual resonant circuits on a multiple resonant frequency tag. Also described is a resonant frequency tag customization apparatus which responds to an input code and provides a tag having resonant circuits with different frequencies selected in accordance with the input code. Preferred RF tag configurations/constructions and a method of making such tags are also disclosed. Also described are additional RF tagging system features related to the use of phase shifting/polarization, object approach detection and measuring both voltage and current signals so as to provide improved RF tag detection systems. These and other features of the present invention will be more fully understood in connection with the subsequent description of the preferred embodiments of the present invention.

BRIEF DESCRIPTION OF THE DRAWINGS

FIG. 2 is a schematic diagram of a variation of the tagging system shown in FIG. 1.

FIG. 5 is a perspective view of a tag for utilization in the system shown in FIG. 1.

FIGS. 6 through 8 are illustrations of various layers which comprise resonant circuits which form portions of the tag shown in FIG. 5.

FIG. 9 is a flowchart of the overall operation of the systems shown in FIG. 1 and 2.

FIGS. 10 and 11 are additional flowcharts which illustrate more detailed operation of the flowchart shown in FIG. 9.

FIG. 12 is a cross-sectional view of one resonant circuit provided on the tag shown in FIG. 5 and utilizing the circuit layers shown in FIGS. 6 through 8.

FIG. 13 is a perspective view of an RF tagging system which utilizes several aspects of the present invention.

FIG. 14 is a block diagram of a post manufacturing apparatus for customizing an unprogrammed tag.

FIG. 15 is a flowchart illustrating the operation of the apparatus in FIG. 14.

FIG. 16 is a top view of resonant circuit metalizations for tags used with the apparatus shown in FIG. 14.

DESCRIPTION OF THE PREFERRED EMBODIMENTS

Figure 1:
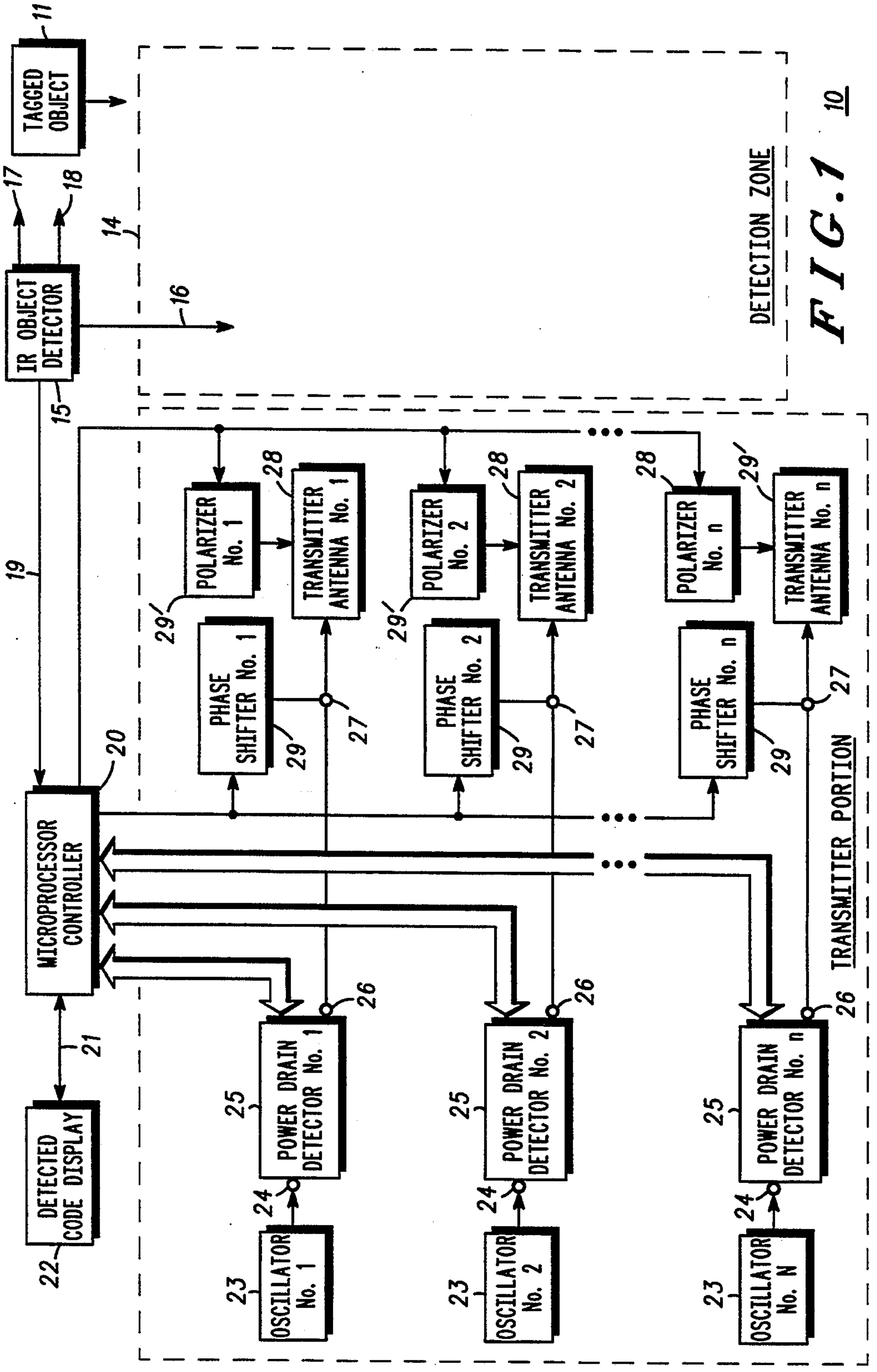
FIG. 1 is a schematic diagram of an RF tagging system constructed in accordance with the present invention.

Referring to FIG. 1, a multiple tuned frequency RF tagging system 10 is illustrated. The system is intended for operation with a tagged object 11 which has a tag 12, such as shown in FIG. 5, attached thereto. On the tag 12 shown in FIG. 5, there are a plurality of passive resonant circuits 13 arranged in a 3×4 array with each of the passive resonant circuits 13 resonant at a different resonant frequency selected from a predetermined plurality of known resonant frequencies. By selecting the resonant frequencies for each of the circuits 13, the tag 12 can have a code which specifically identifies either the identity of the tagged object 11 or identifies other information such as the address to which the tagged object should be directed or the address from which the tagged object has been sent. This other information could also comprise information specifying a desired transaction to be implemented. The specific type of information represented by the code embodied in the tag 12, as represented by the various tuned frequencies of the circuits 13, is not significant except that it is contemplated that each different tagged object or class of tagged objects will have a different code associated with it.

The basic function of the RF tagging system 10 in FIG. 1 is to determine what is the code associated with the tagged object 11 wherein this code is represented by the frequencies to which the plurality of circuits 13 are tuned. Code identification by the system 10 will be performed when the tagged object 11 enters a detection zone or detection field 14 shown dashed in FIG. 1. The presence of the tagged object 11 in the detection zone 14 is implemented by an IR (infrared) object or presence detector 15 wherein an IR beam 16 is directed towards the detection zone 14 such that the detector 15 will produce an output whenever any object is provided in the detection zone 14. The IR object detector 15 also provides a first IR detection beam 17 and a second IR detection beam 18 wherein these detection beams are provided outside the detection zone 14 and at sequential distances from the detection zone. The function of the beams 17 and 18 is to note the approach of an object towards the detection zone 14, while the beam 16 is to detect the presence of that object when it enters the detection zone 14. The detected object may have any number of resonant circuits 13 provided on it, including zero.

All of the signals provided by detections caused by the IR beams 16 through 18 are provided on a multiple input connection line 19 which serves as an input to a microprocessor controller 20 of the system 10. Other types of controllers, besides a microprocessor, could be used for the controller 20. The microprocessor controller 20 will provide a code signal corresponding to the code represented by the different tuned frequency circuits on the tagged object 11. This code signal is provided on a connection 21 to a detected code display device 22, such as an LCD display. However, it should be noted that the display of the code is not required since the device 22 may comprise other apparatus, rather than a display, which reacts to the predetermined code signals provided by the microprocessor controller 20. In other words, the device 22 could comprise a routing apparatus which, upon identification of the code of the tagged object 11, will move the tagged object out of the detection zone and route it to a specific other location based on the code of the object. In this manner, the system 10 can be used for baggage routing or inventory routing as desired. The system 10 also could be used to actuate an access mechanism or to execute a transaction based on object price.

Essentially, the microprocessor controller 20 accomplishes the providing of the code signal to the display 22 by controlling system operations to detect the plurality of passive resonant circuits 13 when they are in the detection zone 14. The code signal provided on the line 21 is indicative of what resonant frequency circuits 13 have been detected as being present on the tag 12. This is accomplished in the following manner.

The system 10 is contemplated as comprising a plurality of n separate oscillators 23 each producing as an output a different oscillator signal at each one of a plurality of n known resonant frequencies which may be provided for each of the resonant circuits 13 on the tag 12. Each of these oscillator signals is provided at a separate output terminal 24 that is connection as an input to each of n separate power drain detectors 1 through n indicated in FIG. 10 by the reference numeral 25. Each of the power detectors 25 receives signals from the microprocessor controller 20 and provides signals to the microprocessor controller 20. Each of the power detectors 25 also provides, at an output terminal 26, an output which is connected to an input terminal 27 of a plurality of n different transmit antennas 28. A plurality of n different phase shifters 29 are also connected to the terminals 27 and receive control signals via connections to the microprocessor controller 20. Also a plurality on n different polarization control circuits (polarizers) 29' are connected to each of the antennas 28 and receive control signals via connections to the controller 20.

Essentially, the system 10 provides a plurality of different frequency oscillators signals at each one of the plurality of known resonant frequencies which may be selected for the circuits 13. These signals are provided at the terminals 24 and corresponding frequency signals are also provided at the terminals 27 for radiation by the antennas 28 into the detection zone 14. The system 10 shown in FIG. 1 contemplates the simultaneous radiating of each of these different frequency oscillator signals into the zone 14. Thus it is not necessary to incur time delays waiting for sequentially switching of each of these frequency signals and then radiating them into the detection zone. Prior circuits which implemented such sequential switching and radiation would incur a substantial time delay when a large number of different frequencies is contemplated. Since typically a very large number of different codes is desired, this can result in the requirement for a relatively large number of different resonant frequencies such as 20 or more different frequencies. Incurring a large time delay can lead to errors in identifying the code on a tagged object if the object must rapidly move through the detection zone, and rapid movement is of course a desirable end result. If the tagged object must wait in the detection zone for the switching in of all the different frequency signals to be radiated, this slows the throughput of the system and makes the system less desirable. However, clearly the present system does not suffer from this deficiency.

Figure 3:
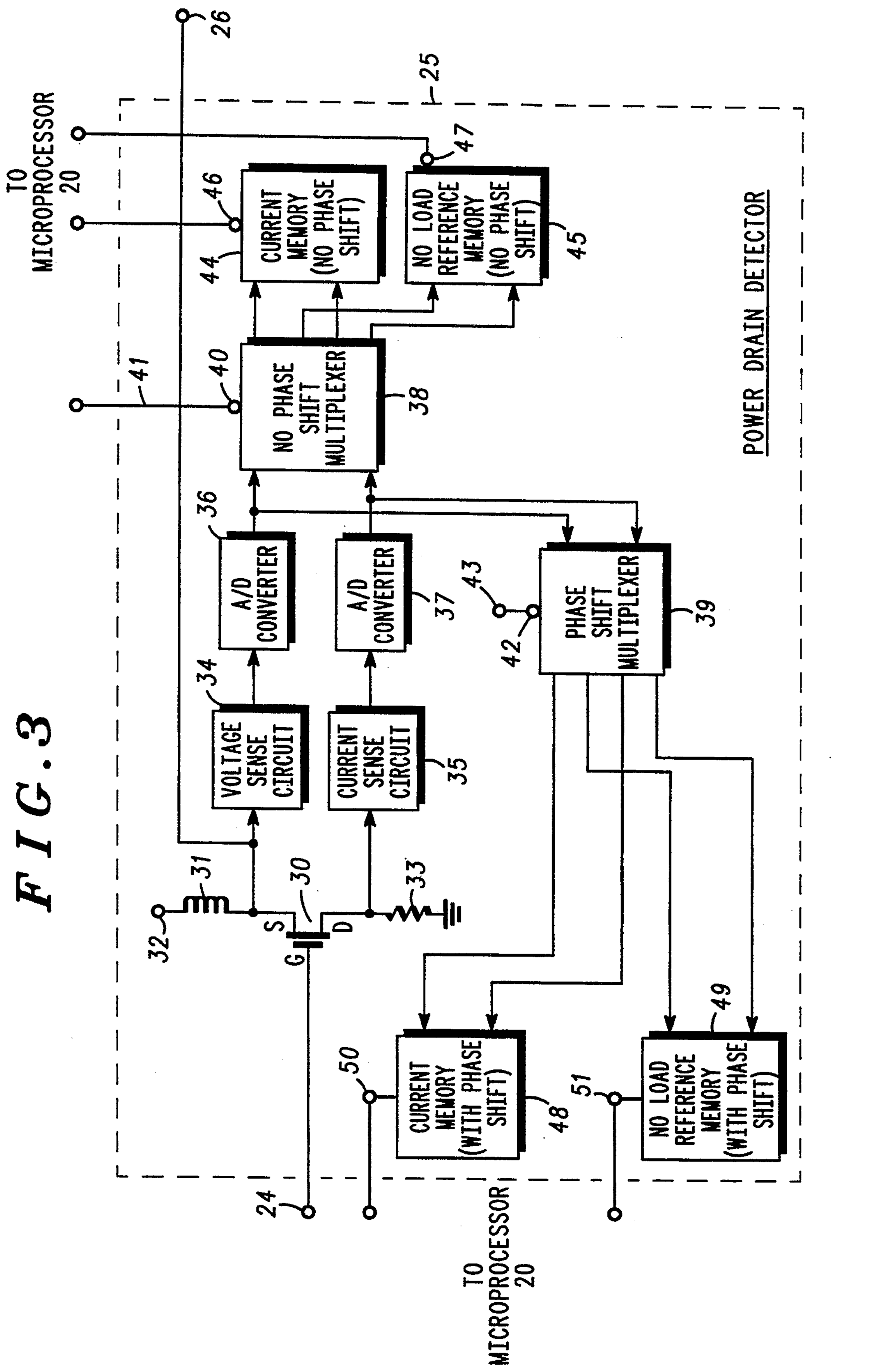
FIG. 3 is a schematic diagram of one of the components of the system shown in FIG. 1.

For the system 10 in FIG. 1, the existence of any one resonant frequency circuit on the tag 12 attached to the tagged object 11 is determined by the power drain detector 25 which is associated with and receives a corresponding resonant frequency signal from one of the oscillators 23. This detection preferably occurs similar to a grid dip type detection. In grid dip type detector circuits, a signal is radiated at a specific frequency creating a local radiation field. If a resonant circuit at that same frequency is provided in the radiation field this will effectively load the radiation field and absorb energy at the resonant frequency during signal radiation. The effect is that the magnitude of the signal being radiated will be altered when a load is provided in the radiation field and the load comprises a circuit resonant at the same frequency being radiated. Essentially, the function of the power drain detector 25 is to detect the loading at any of the specific frequencies provided by the oscillator 23 so as to conclude that a corresponding circuit resonant at any of those oscillator frequencies is now in the detection zone 14. While standard grid dip detection circuits can be utilized for the power drain detectors 25, FIG. 3 illustrates a preferred embodiment of the power drain detectors 25. The structure of the power drain detector 25 shown in FIG. 3 will now be discussed in detail.

Referring to FIG. 3, a preferred embodiment for each of the power drain detectors 25 is illustrated. At a terminal 24, one of the oscillators 23 will provide, as an input to the power drain detector 25, an oscillator signal having a frequency selected from a predetermined plurality of known resonant frequencies wherein any of the circuits 13 on the tag 12 can be tuned to any of these predetermined frequencies. The terminal 24 is connected to the gate G of a FET transistor 30 having a source terminal S connected through an RF choke 31 to a B+ terminal 32 and a drain terminal D connected through a resistor 33 to ground. The source terminal is also connected as an input to a voltage sense circuit 34 and directly connected to the output terminal 26 of the power drain detector 25 wherein this output terminal is directly connected to the transmitter antenna 28 which will radiate the signal at the terminal 26. The drain terminal of the transistor 30 is connected as an input to a current sense circuit 35. Each of the circuits 34 and 35 provides an input to associated A to D converters 36 and 37, respectively, which then process the analog signals received and provide corresponding digital signals as outputs to a no phase shift multiplexer circuit 38 and a phase shift multiplexer circuit 39.

A control terminal 40 of the no phase shift multiplex circuit 38 receives a control input via a connection 41 to the microprocessor controller 20. Similarly, a control terminal 42 of the phase shift multiplexer circuit 39 receives its control input from a connection 43 which extends from the microprocessor controller 20. The multiplexer 38, depending upon the signal provided at the terminal 40, will either provide a pair of inputs to a current memory (no phase shift) 44 or a no load reference memory (no phase shift) 45. These memories have output terminals designated as 46 and 47, respectively, which provide inputs to the microprocessor controller 20. In a similar manner, the phase shift multiplex circuit 39 provides a pair of outputs, in accordance with the control signal at the terminal 42, to either a current memory (with phase shift) 48 or a no load reference memory (with phase shift) 49 wherein these memories have effective corresponding output terminals 50 and 51, respectively. The memory output terminals 46, 47, 50 and 51 are each connected as inputs to the microprocessor controller 20. The manner in which the power drain detector 25 shown in FIG. 3 and the RF tagging system shown in FIG. 1 operate will now be discussed in connection with the flowcharts shown in FIGS. 9 through 11. These flowcharts are implemented by the programming of the controller 20. Subsequently, the variation to the system 10 contemplated by the structure shown in FIGS. 2 and 4 will be discussed.

Referring to FIG. 9, a flowchart 60 is illustrated which commences at a step 61 that turns on all the oscillators 23. Control passes to a terminal 62 and from there to a decision block 63 which inquires if there has been a detection of an object which is about to enter the detection zone 14.

As previously noted, this is implemented by IR object detector 15 and the IR beams 17 and 18. More specifically, as a tagged object 11 approaches the detection zone 14, it will first pass through the IR beam 17 and then the IR beam 18. When this sequence of detection occurs, the microprocessor controller 20 concludes that there is an object moving towards, approaching, the detection zone 14, but that this object has not yet reached the detection zone since IR beam 16 has not yet detected object presence in the zone 14. If no such object approach detection occurs, control passes from the block 63 back to the terminal 62 until such a detection is made. Once such a detection has been made control passes from the decision block 63 to a process block 64 indicative of the implementation of a calibration routine.

The calibration routine 64 is illustrated in FIG. 10. At the start of the calibration routine 64, designated by the numeral 65, control passes to a block 66 which converts sensed voltage and current signals into digital signals for each of the oscillator frequency signals provided at the terminal 24. The block 66 essentially corresponds to the action of the FET transistor 30 and the sense circuits 34 and 35 and the analog to digital converters 36 and 37. In essence, the output of the A to D converter 36 is a digital signal related to the voltage of the oscillator signal provided at the terminal 24, whereas the signal provided by the A/D converter 37 is indicative of the current related to this signal. Since the source of the transistor 30 is connected directed to the terminal 26, the converters 36 and 37 provide digital signals related to the magnitude of the voltage and current of the specific resonant frequency signal to be radiated by one of the antennas 28. By measuring both voltage and current, and considering both of these parameters when making the determination if there is a load on the radiation field provided in the detection zone 14, a more accurate determination of absorption of energy by a resonant circuit in the detection zone 14 can be achieved. Thus, preferably both voltage and current signals are monitored by process block 66 to provide a more accurate indication of absorption of energy by a resonant circuit in the detection zone 14.

From block 66, control passes to block 67 which results in storing the signals from the converters 36 and 37 in the no load reference memory (no phase shift) 45. It should be remembered that the calibration routine 64 is being implemented prior to the tagged object 11 entering the detection zone 14 and in response to the IR object detector 15 detecting an object approaching the detection zone 14.

From process block 67, control passes to block 68 which implements a 90 degree phase shift for the antennas 28. This phase shift is provided by a control signal provided by the microprocessor controller 20 to each of the phase shifters 29. These phase shifters can essentially just switch in an appropriate capacitive or inductive load to implement a phase shift of a known amount to the radiation pattern produced by each of the antennas 28. After the implementation of this phase shift, control passes to a block 69 in which the voltage and current signals provided after the implementation of the phase shift are converted to digital signals. Process block 70 then stores these after phase shift signals in the no load reference memory (with phase shift) 49. The gating of the outputs of the converters 36 and 37 to the proper memories is implemented by the multiplexer circuits 38 and 39, while the storing of information in the memories 45 and 49 is implemented by the microprocessor controller 20 controlling the write functions of these memories by various control lines which are not specifically illustrated in FIG. 3 for the purpose of clarity. After the block 70, control passes to a step 70' which reimplements steps 66–70 after changing the polarization for the antennas 28. Then control passes to a return step 71 by which control returns to the flowchart 60 and proceeds on to a terminal 72.

In essence, the calibration route 64 measures signals related to the voltage and current of each of the oscillators 23 as measured for first a no phase shift and then a 90 degree phase shift for the antenna radiation patterns wherein this occurs upon the approaching of a tagged object 11 to the detection zone 14. These stored no load voltage and current signals will then be considered by the microprocessor controller 20 when determining if there is a significant absorption of radiation at a specific resonant frequency when the tagged object 11 is in the detection zone 14. Thus the signals stored in the memories 45 and 49 are referred to as no load signals since they represent the background or normal type of loading provided by the detection zone 14 (a) in the absence of any tuned circuits in the detection 14 having frequencies corresponding to the oscillators 23, and (b) just prior to the object 11 entering the zone 14. Step 70' implements the above results for a different antenna polarization to create separate additional no load reference signals for a different antenna polarization. To implement step 70' controller 20 uses the polarizers 29' to change the polarization of the antennas 28.

Referring again to FIG. 9, after the terminal 72 control passes to a decision block 73 which inquires if the tagged object 11 has now entered the detection zone 14. This detection, as indicated above, occurs through the utilization of the IR object detector beam 16 which is separate and apart from the microprocessor controller 20 determining that circuits are present within the detection zone at specific frequencies corresponding to the frequencies of the oscillators 23. Until a tagged object is provided in the zone 14, control continues to recirculate between the terminal 72 and block 73. When an object is detected in the zone 14, control then proceeds to a block 74 which implements a tag code identification routine illustrated in FIG. 11.

It should be noted that by storing the no load information in response to detecting the approach of a tagged object to the detection zone, a more accurate determination of what resonant frequency circuits are provided in the detection zone 14 is obtained. This is because the background loading level for the oscillators 23 is now being measured immediately before a tagged object enters the zone 14 in response to detecting the approaching of an object to the zone. Thus long term drift effects which may alter the ambient loading of the antennas 28 are compensated for since the no load condition of these antennas is measured immediately prior to a tagged object entering the detection zone. It should also be noted that while an IR object detector 15 is illustrated as detecting both the approach of a tagged object to the zone 14 and the presence of a tagged object in the zone 14, other types of detection apparatus could be utilized. These other type of separate detection apparatus could be, for example, just push button or position sensors which are depressed upon contact by a moving tagged object immediately before the zone 14 and in the zone 14. Also, other types of detectors, such as optical, radio (microwave), sonic or weight detectors, rather than IR (infrared) detectors, could be used. The end result will be substantially the same.

Figure 11:
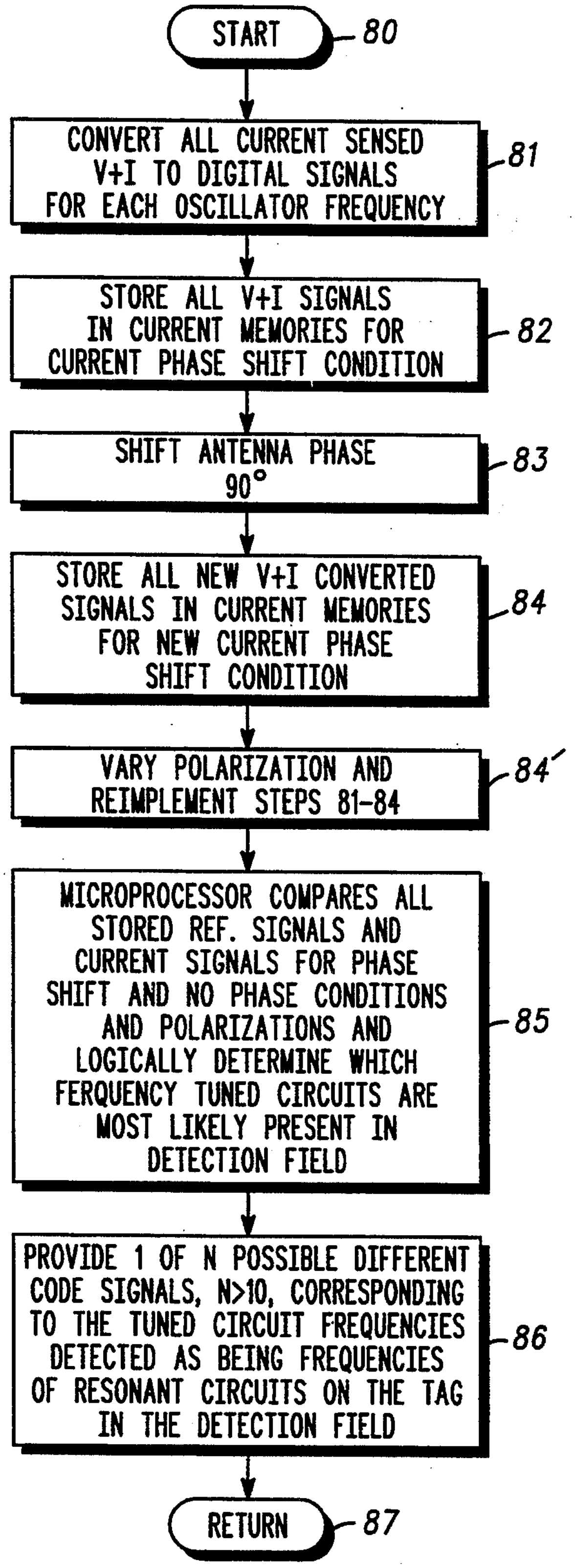

Referring now to FIG. 11, the tag code identification routine 74 is illustrated as starting at a block 80 and proceeding to a block 81 for implementing the conversion of all current (in time) sensed voltage and current oscillator signals to digital signals. A process block 82 then stores these current digital signals for whatever the current phase shift condition is and then a block 83 shifts the phase of the antenna radiation patterns by 90 degrees. Subsequently a block 84 again stores the current (in time) voltage and current signals for this new phase shift condition. It is apparent that the blocks 81 through 84 correspond to the operation of the sense circuits 34 and 35 and the converters 36 and 37, along with the multiplexers 38 and 39, routing the converted signals to the current memories 44 and 48. This all occurs when the tagged object 11 is in the detection zone 14. The phase shift for the antenna patterns is again implemented by the microprocessor controller 20 via the phase shifters 29.

From the process block 84, preferably control passes to step 84' which reimplements steps 81–84 after changing the polarization of the antennas 28. This corresponds to the controller 20 altering the polarization of the antennas 28 via action of the polarizers (control circuits) 29'. Then control passes to a process block 85 which represents the manner in which the microprocessor controller 20 analyzes the voltage and current signals stored in the memories 44, 45, 48 and 49. Essentially, the microprocessor controller 20 is looking for a substantial loading in the detection zone 14 at any of the specific resonant frequencies of any of the oscillators 23. This loading will be attributed to the presence of a circuit in the detection zone 14 which is resonant at the frequency of one of the oscillators 23. While other grid dip type detection circuits merely look at one signal and apparently compare it to some fixed threshold, clearly it is better to compare measured loading when an object is in the detection zone 14 to loading measured when you are sure there is no resonant circuit in the detection zone 14 at that particular frequency. Thus the microprocessor controller 20 will compare the no load and loaded conditions for the zone 14 to determine if a specific resonant frequency circuit is present in the zone.

Also, since the orientation of the tagged object 11 may not be known or controllable, sometimes the loading by a tuned circuit in the zone 14 will be substantially pronounced just for a specific amount of phase shift and/or polarization implemented for the antenna 28. Thus the present invention contemplates measuring load and no load conditions for various phase shifts in order to more accurately detect if a resonant circuit at a particular frequency is in the detection zone 14. Also, as noted above, sometimes it is easier to detect the variation of a voltage signal or a current signal related to the magnitude of the oscillator output signal produced by the oscillators 23 in response to tuned circuit loading in the zone 14. The power drain detector 25 shown in FIG. 3 illustrates how both of these parameters can be monitored and utilized by the microprocessor controller 20 to implement such a comparison.

It should be noted that while measuring signals for two different phase shifts enhances the detection of a resonant circuit as mentioned above, measuring signals for two different antenna polarizations can also enhance resonant circuit detection and make it less sensitive to tag orientation in the detection zone 14. Thus each of the antennas 28 has separately actuable horizontal and vertical polarization elements which are controlled by the polarizers 29' to implement either vertical or horizontal polarization.

Preferably the controller 20 will vary the polarization of the antennas 28 to create a matrix of measured signals comprising load, no load, phase shift, no phase shift, and vertical and horizontal polarization signals. All these signals will be stored by the power drain detectors 25 and then analyzed by the microprocessor controller. Thus each power detector 25 multiplex circuit and memory shown in FIG.3 has additional capacity and handles and stores both vertical and horizontal polarization versions of the load, no load, phase shift and no phase shift signals described above, and the microprocessor controller 20 preferably analyzes all of these signals when detecting a resonant circuit. These same polarization variations apply to the receiver power detectors shown in FIG. 4. For the flowcharts shown in FIGS. 10 and 11, these also contemplate control, storage and analysis of measured signals for horizontal and vertical polarization, and use of these different polarization measured signals for resonant circuit detection.

Preferably, the microprocessor controller 20 can utilize current advanced logic techniques, such as fuzzy logic, to arrive at a improved determination of if tuned circuits at specific frequencies are in the detection zone 14. However, even without the use of fuzzy logic and its inherent learning by trial and error characteristics, any microprocessor controller 20 can compare the load and no load, phase and no phase signals stored for the oscillator voltage and current signals and detect a major variation in one or more of these signals which will then indicate the presence of a tuned circuit at a specific frequency in the detection zone 14. In this manner, the power drain detector 25 in FIG.3 represents an improved grid dip type detection for the RF tagging system 10. In a broader sense, process block 85 represents the controller 20 analyzing measured signals, at each one of the frequencies of the oscillators 23, indicative of absorption of radiated energy by resonant circuits on tag 12.

After the process block 85, control in the flowchart 74 passes to the process block 86. The process block 86 represents the microprocessor controller 20 responding to the detection of which tuned frequency circuits are in the detection zone 14 by providing a one out of n different possible code signals, wherein preferably n is greater than 10, to the detected code display device 22. In other words, when the microprocessor controller 20 determines which tuned circuits are in the detection zone 14, it can then construct a code indicative of that conclusion and provide a code signal or signals to the display device 22 which will indicate what tuned circuits are in the zone 14. These tuned circuits are therefore utilized to identify either the identity of the tagged object or its destination or other specific characteristics of the tagged object. The code signals could also be utilized to control subsequent apparatus such as shipping apparatus to properly route the tagged object out of the detection zone 14 and to other subsequent apparatus. After the process block 86, control passes to a return block 87 that results in control returning to the flowchart terminal 62 in the FIG. 9 flowchart 60.

The system 10 in FIG. 1 described above utilizes grid dip type detection to determine the current (in time) loading of radiating oscillator signals "during" the time that these oscillator signals are actually radiated. The system 10 contemplates the simultaneous transmission (radiation) of these oscillator signals so as to not require the sequential radiation of each of a large number of different frequency oscillator signals. This saves time by permitting a more rapid detection of which tuned circuits are on the tagged object 11 when it is present in the detection zone 14. Some prior systems do not detect the loading of a radiated signal by using a grid dip method type detector, but instead rely on passive resonant circuits on the tagged object to continue ringing (oscillating and reradiating) after they have been excited by radiated oscillator signals of the same frequency. These systems also generally measure signals indicative of the absorption of energy by resonant circuits in the detection zone, but they do this by measuring reradiated signals after the initial radiation ceases. It should be noted that such prior systems are also inherently slow in that they require first the transmission of the signal to the passive resonant circuit and then the waiting for that resonant circuit to subsequently ring after transmission of the oscillator signal by the transmit antenna has ceased. Clearly the system 10 represents a substantial improvement over such systems. However, certain aspects of the present invention, such as comparing phase shift and no phase shift and/or vertical/horizontal polarization measured signals, and/or monitoring and comparing both voltage and current signals, can be advantageously used in such reradiating systems. Such reradiating systems can also have improved detection accuracy by comparing load and no load signals, especially when no load signals are measured and stored in response to detecting the approach of an object to the detection zone 14.

Figure 4:
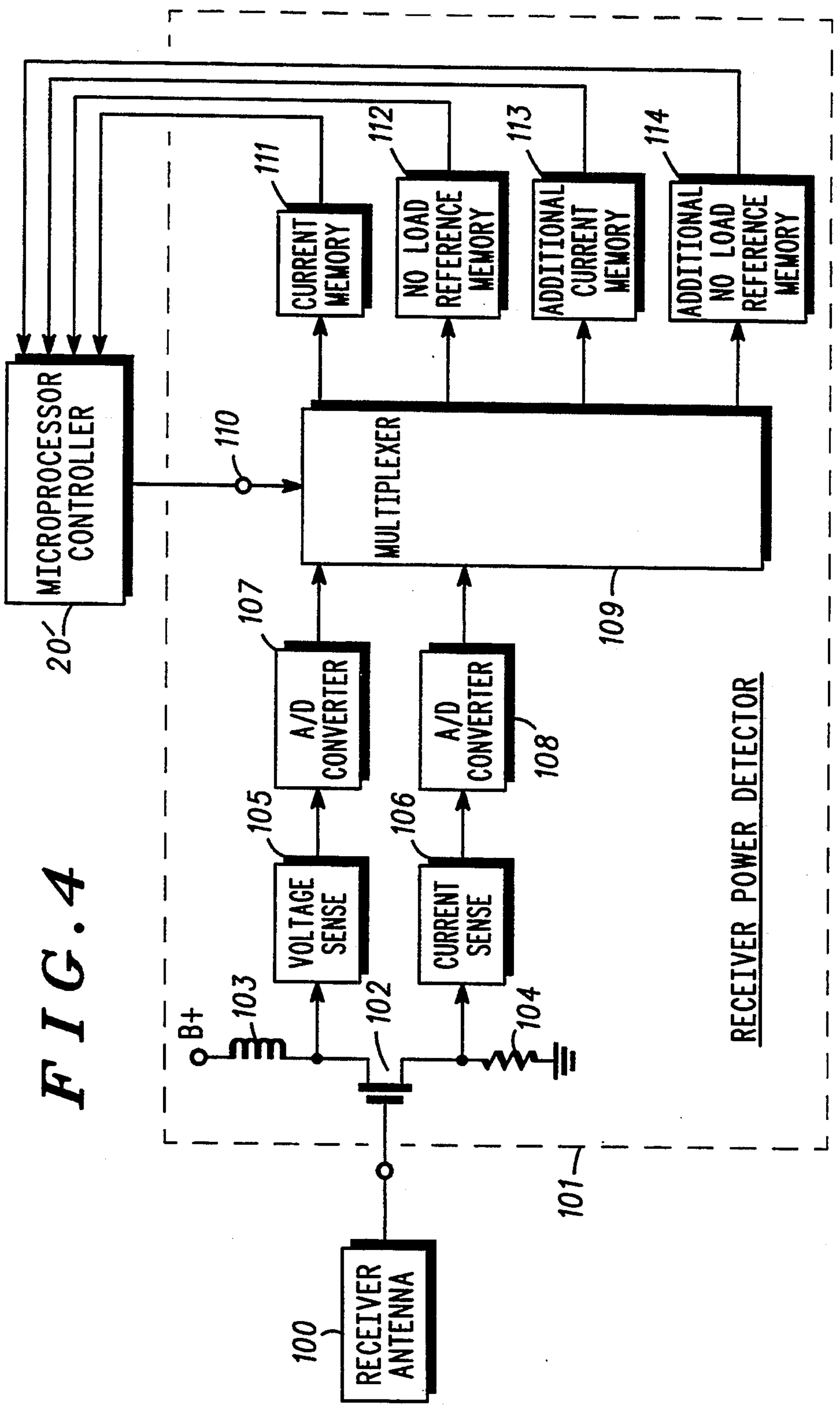
FIG. 4 is a schematic diagram of one of the components of the system variation shown in FIG. 2.

As indicated above, the specific construction of the power drain detectors 25 implements an improved energy absorption detection for the RF tagging system 10. FIGS. 2 and 4 represent a variation of the system 10 which can produce an additional incremental improvement. This variation utilizes not only the same structure in the system 10 shown in FIG. 1, but uses some additional structure to obtain a more reliable detection of the existence of a tuned circuit at a specific frequency in the detection zone 14.

Referring to FIG. 2, the detection zone 14 and tagged object 11 are illustrated and correspond to the same components shown in FIG. 1. The FIG. 2 system also includes all of the FIG. 1 components 22–29, but only the transmit antennas 28 are shown in FIG. 2. A microprocessor controller 20' is also illustrated in FIG. 2 and implements all the same functions and has all the same connections as the microprocessor controller 20 shown in FIG. 1, except that some additional functions and connections are contemplated. In FIG. 2, a plurality of n receiver antennas 100 are provided on one side of the detection zone 14. Preferably, the n transmit antennas 28 are provided on one side of the detection zone 14 and the n receiver antennas 100 are provided on an opposite side of the detection zone 14 with the tagged object 11 intended for passage between the transmit and receiver antennas. Each of the n receiver antennas 100 is connected to one of n associated received power detectors 101 which receive control signals from and provide information signals to the microprocessor controller 20'.

FIG. 4 illustrates some details of the receiver power detectors 101 which include an input FET transistor 102, an RF choke 103, a current sensing resistor 104, a voltage sense circuit 105, a current sense circuit 106, A to D converters 107 and 108, a multiplexer circuit 109 receiving a control input at a terminal 110 from the microprocessor 20', and four memories comprising a current memory 111, a no load reference memory 112, an additional current memory 113 (for a different phase shift) and an additional no load reference memory 114 (also for a different phase shift). The receiver power detector 101 in FIG.4 functions similarly to the power drain detector 25, except that now voltage and current signals related to received signals at the antenna 100 are converted to digital signals, and, via the multiplexer 109, sent to various memories depending upon if an object is approaching the zone 14 or in the zone 14 and depending upon whether no phase shift or a 90 degree phase shift is implemented for the radiation patterns provided by the antennas 28. There are information signal and control connections from each of the memories 111 through 114 to the microprocessor 20'.

Essentially, the receiver power detector 101 monitors received signals at the antennas 100 and stores signal levels for voltage and current in each of the memories 111 through 114 for various load and phase shift conditions. By noting these conditions and comparing the stored signals, and also noting the conditions and using the signals provided by the power drain detector 25, the microprocessor controller 20' can produce a more accurate detection of a circuit in the detection zone 14, since it will be able to analyze more inputs which may be varied when a tuned circuit of a specific frequency is provided in the detection zone 14. Sometimes, the loading effect of a tuned circuit in the zone 14 will primarily effect the magnitude of the signals being transmitted and a grid dip type detector will produce an accurate indication of the presence of this circuit. However, other times the tuned circuit may be substantially further away from the transmitting antenna and much closer to a receiving antenna on an opposite side of the detection zone. In this case, the receiver power detector 101 may produce signals that more readily indicate the presence of a tuned circuit at a specific frequency in the detection zone.

The RF tagging system contemplated by modifying the system 10 to include the apparatus in FIGS. 2 and 4 can be utilized to provide a more accurate determination of the presence of a tuned circuit in the detection zone 14. The flowcharts for such a modified system will substantially correspond to the flowcharts discussed in FIGS. 9 through 11, except that now the step 85 will include considering received antennas signals, and the signal storing steps will also store received signal magnitudes of voltage and current in the memories 111 through 114. This should be apparent to those of average skill in the art.

Figure 7:
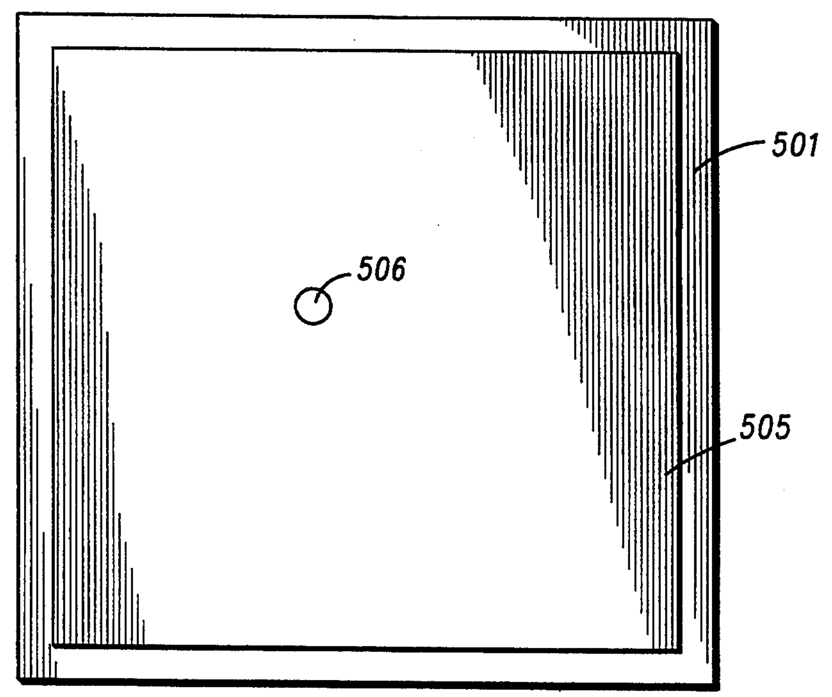
Figure 8:
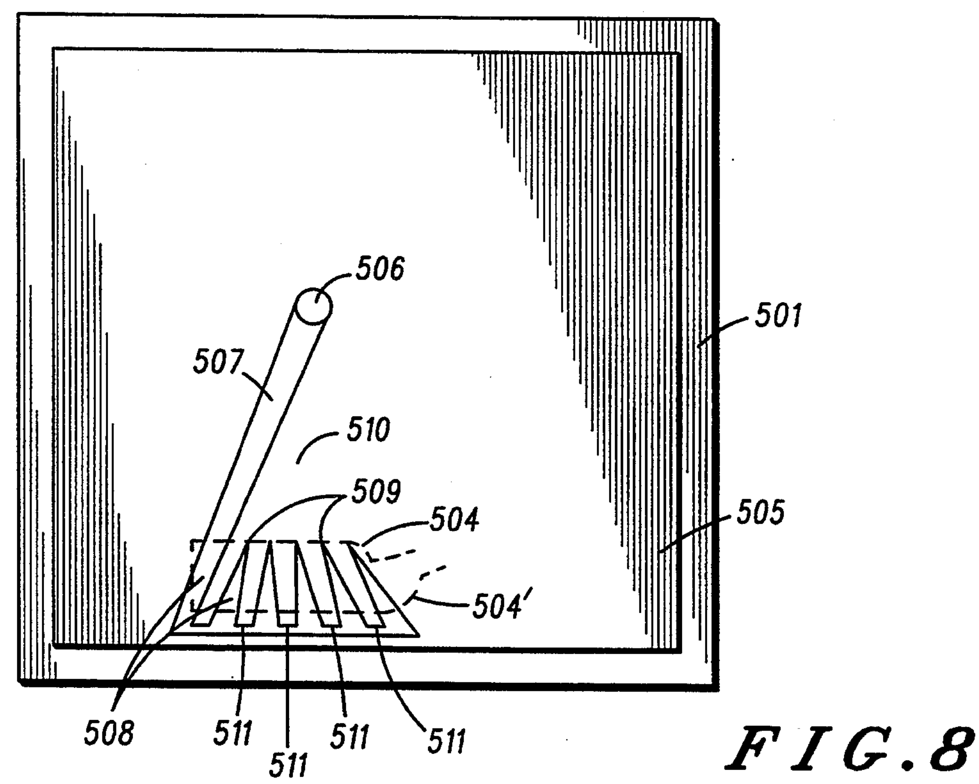

Referring now to FIG. 5, as stated before, this illustrates the tag 12 which may be applied to the tagged object 11 shown in FIG. 1. The tag 12 has a top planar surface 501 of a carrier base 500 on which the plurality of tuned resonant circuits 13 are provided in an array. FIG. 6 illustrates an expanded view of one metalization which forms a portion of one of the tuned circuits 13. In this case, FIG. 6 illustrates a spiral inductance metalization area 502 provided on the top surface 501 with the spiral commencing at a central location 503 and spiraling outward after several turns to terminate in an expanded end portion 504 which can function as one plate of a capacitor. Other inductor metalization geometries, rather than a spiral, are also possible for implementing the inventions claimed herein. FIG. 7 illustrates a dielectric layer 505 applied on top of the inductance layer 502 shown in FIG. 6 with a through hole 506 being provided in registration with the central area 503. FIG. 8 illustrates a metalization layer 507 provided on top of the dielectric layer 505. The metalization layer 507 commences at the through hole opening 506 and proceeds radially outward and terminates in a metalization area 508 which essentially is in registration with the area 504 on the bottom metalization layer 502. The metalization area 508 forms one plate of capacitor with area 504 forming the other plate.

The metalization area 508 preferably comprises a plurality of planar metalization projections 509 each preferably extending radially inward toward a central location 510 and each projection 509 connected to each other by a thin conductor runner 511. The runners 511 essentially are disposed away from and outward with respect to the central location 510. The function of the runners 511 is to provide an easy way to adjust the capacitance implemented by the metalization 507, and its area 508, such that the frequency of a tuned circuit can be adjusted in predetermined known steps.

While each of the tuned circuits 13 can be manufactured initially with a specific different frequency, preferably each of these tuned circuits can be made adjustable such that the tag 12 can be coded in the field after its manufacture when information as to final code to be provided on the tag is definitely known. Additionally, even during factory manufacture of the tag 12, it may be easier to adjust frequencies in known steps of frequency by utilizing the preferred configuration for the capacitor plate shown in FIG. 8. This is because breaking any of the runners 511 will remove specific known areas of a capacitor plate and thereby change the capacitance of a tuned circuit by a known amount. This will result in a known increase in resonant frequency which can be readily achieved merely by making a small cut in one or more of the runners 511. Many times this will be preferable to an infinitely variable and gradual removal of the total capacitive metalization such as by gradually grinding or scrapping away portions of a single unitary capacitor plate. While some prior systems have contemplated cutting large holes in capacitor plates to implement a similar step adjustment, this compromises the mechanical integrity of the tuned circuit since typically a large hole is contemplated to remove a substantial amount of capacitive plate. This is not the case with the configuration shown in FIG. 8 in which only small metalization cuts are needed.

Placing the runners 511 away from the central location 510 provides easier access to the runners 511 and makes it easier to cut them without disturbing other metalizations. Preferably, the runners 511 do not horizontally overlap the bottom metalization area 504 (shown dashed in FIG. 8) and are therefore positioned beyond a boundary 504' of the area 504. This is in contrast to the projections 509 which do horizontally overlap the metalization area 504 and together therewith provide resonant circuit capacitance. This configuration is advantageous since any cutting of the runners 511 will not disturb the integrity of the bottom metalization area 504. Also, if a laser is used to cut the runners 511, then the preferred configuration will prevent the laser from creating unintentional short circuits between the metalization projections 509 and runners 511 and the metalization area 504, since the cut runners 511 are horizontally spaced away from and beyond the boundary 504' of the area 504. During laser cutting, the laser could cut through the dielectric layer and fuse any overlapping top and bottom metalizations together unintentionally.

Referring to FIG. 12, a general cross sectional diagram illustrating the preferred layerized construction of one of the tuned circuits 13 is shown. On the bottom side of a mylar base layer 120, an adhesive layer 121 is provided and a no stick backing layer of paper or some other removable material 122 is then provided. On top of the mylar base layer 120, a metalization layer 123 is provided corresponding to the inductance metalization 502 shown in FIG. 6. On top of the metalization layer 123, a dielectric insulating layer 124 is illustrated having a through hole corresponding to the through hole 506. The dielectric layer 124 corresponds to the dielectric layer 505 shown in FIG. 7. On top of the layer 124, a capacitive plate metalization layer 125 is illustrated corresponding to the metalization 507 shown in FIG. 8. On top of the metalization 507 an optional protective layer 126 is shown in FIG. 12. While mylar is preferred for the base layer 120, other materials could be used.

FIG. 12 is not shown with cross hatching to enhance its clarity. Specifics regarding the configurations of each of the layers shown in FIG.12 are not depicted since FIG. 12 is just intended to illustrate the layerized structure of the different layers which comprises the tuned circuits 13. These layers may be implemented by various conventional manufacturing techniques such as print and etch, using photo lithography techniques. It should be noted that the through hole 506 is contemplated as being a conductive feed through hole so as to provide an electrical connection between the layers 125 and 123 corresponding to the metalizations 502 and 507. This can be achieved by providing conductive ink in the hole 506. In this manner the inductor formed by the metalization 502 will be connected through this through hole 506 to a capacitance formed primarily by the capacitor area 508 on the top side and the capacitor plate area 504 on the bottom side.

Preferably the metalizations 502 and/or 507, and dielectric layer 505, even for initial manufacturing of the tag 12, are formed of conductive (metalizations 502 and 507) and non conductive (dielectric layer 505) inks which have been printed on the tag carrier base with specific desired geometries. This differs from the prior technique of etching uniform metal layers to create RF tag metalization layers having desired geometric patterns. The printing of conductive inks is more adaptable to cost effective mass production techniques. For initial manufacture of tags, thick film or low temperature cure conductive inks can be used.

With regard the system 10 shown in FIG. 1, this system can be utilized for RF tagging applications in which the orientation of the tagged object 11 is not controlled with respect to the radiation patterns provided by the antennas 28. While this is preferred in many applications since it allows detecting any tuned circuit in the detection zone 14, regardless of its positioning on the tagged object 11, one consequence of this is that fewer total possible codes are possible if there is a fixed limit on the number of different tuned frequencies to be detected. This is because once a tuned frequency has been used for one of the tuned circuits 13, then that tuned frequency cannot be utilized for another one of the tuned circuits unless the power drain detectors detecting circuit loading are extremely sensitive so as to discriminate between having one or several tuned circuits in the zone 14 which are tuned to the same resonant frequency. Thus, for example, if there are four different oscillators 23 and three different tuned circuits, a total of 14 different codes can be provided. FIG.

13 illustrates a system in which for four different resonant frequencies which are possible for three different tuned circuits 13, a total of 64 different codes can be generated. For such a system the number of codes is equal to $N_F$ (the maximum number of different resonant frequencies for any tag circuit) raised to the power $N_C$ (the maximum number of different resonant circuits used for a code). This will occur because for the system shown in FIG. 13, each tuned circuit is separately investigated with regard to what its specific resonant frequency comprises.

Referring now to FIG. 13, a configuration for a tag 200 and a plurality of 3 fixed location multiple transmitter frequency probes 201, comprising an antenna array, is illustrated. For the tag 200, provided thereon are a plurality of passive resonant circuits 202. Each of the resonant circuits 202 may be resonant at any different frequency selected from a predetermined plurality of known resonant frequencies. Each of the resonant circuits 202 is provided at a different location on a planar surface 203 of the tag 200. The tag 200 is positioned between guide rails 204 so as to fix its position with respect to the plurality of fixed location probes 201. It is contemplated that either the tag 200 will move to the left (as indicated by arrow 205 in FIG.13) such that various rows of tuned circuits 202 will pass directly under the probes 201, or the probes 201 will somehow otherwise be positioned directly above and in registration with the tuned circuits 202 such as by providing the probes in a "bed of nails" type structure which pivots downward with one probe being positioned above each of the positions at which a tuned circuit may exist. While 15 tuned circuits are shown in FIG. 13, a partition 206 of the tag 200 is illustrated to indicate that only three tuned circuits 250, 251 and 252 may be used, if desired, as long as they are maintained in registration with the three probes 201 illustrated in FIG. 13. If desired, a separate probe may be provided for each of the locations of the 15 tuned circuits shown in FIG. 13 so as to avoid the necessity of any sequential movement of the tag 200 through interrogation zones set up by the probes 201.

Essentially, the configuration shown in FIG. 13 still detects when a tuned circuit is within a detection zone set up by any one of the probes 201, and this detection utilizes the same resonant circuit detection concepts utilized for the system 10 shown in FIG. 1. Each of the probes 201 is contemplated as simultaneously radiating each of the possible resonant frequency signals which may correspond to the resonant frequency of any of the circuits 202. However, whereas the system in FIG. 1 contemplated each of the radiating antennas 28 as radiating an essentially omnidirectional radiation pattern to fill the same detection zone 14, each of the probes 201 will have a focused radiation pattern comprising a narrow focused radiation beam having a focus area of size X as projected on the tag surface 203. This can readily be accomplished through the use of wave guides. Each of the resonant circuits 202 provided on the tag 200 will have a surface area of no more than X such that it will completely fit within the focus area of any of the probes 201. Suitable registration between the probes 201 and the tag 200 is implemented by the guide rails 204 and the positioning of the probes 201. It is also contemplated that each of the resonant circuits 202 are spaced apart from each other on the tag planar surface 203 such that no two of the resonant circuits 202 are provided in a focus area of the size X and such that only one of the resonant circuits 202 is provided in the focus area X of any one antenna 201 at any one time. In other words, it is physically impossible for two resonant circuits to be simultaneously positioned in the same focus area implemented by any of the probes 201.

The consequence of the above noted configuration is that each probe 201 will essentially only be able to monitor one resonant circuit at a time. For the system in FIG. 13 this is desired because this permits each resonant circuit to use any of the possible tuned frequencies, including the tuned frequency utilized by another adjacent resonant circuit on the tag 200. Thus, while 4 different frequencies and 3 possible tuned circuits will yield 12 possible codes for the system 10 shown in FIG. 1, the same number of 4 possible different frequencies for a 3 different resonant circuit system, as shown in FIG. 13, will yield a total of 64 possible codes. This is because each tuned circuit can now utilize any of all 4 of the possible frequencies regardless of whether any other cell utilizes the same frequency. In other words, for a tuned circuit, such as the circuit 250 in FIG. 13, any 4 possible different frequencies can be used and identified by the probe 201. For the tuned circuit 251 shown in FIG. 13, again any possible combination of the 4 different frequencies can be utilized for this circuit, and the same is true for the circuit 252. If circuit 250 utilizes one tuned frequency and circuit 251 utilizes the same tuned frequency this represents a totally different code which cannot be misinterpreted because each probe 201 is focused such that it can only read the tuned circuits which pass directly beneath the probe and fit within its associated focused beam zone.

While the type of system shown in FIG. 13 requires maintaining orientation between probes and the tuned circuits on the tag to be read, it allows a significantly larger number of codes to be provided while minimizing the number of oscillator frequencies needed. Systems, such as the system in FIG. 13, wherein each probe has a focused narrow beam area which allows simultaneous monitoring of only a single tuned circuit on a tag that carries many such circuits is not believed to be suggested by the prior art. The fact that RF sensing is utilized for resonant frequency detection means that the type of system in FIG.13 still is an improvement over optical bar code readers which are subject to false readings due to ambient interference with optical paths caused by dirt which may reside on the optical bar code. The system shown in FIG. 13 does not suffer from such a deficiency.

Referring now to FIG. 14, an apparatus 300 is illustrated which is useable for custom programming tags which have individual resonant circuits resonant at frequencies selected from a plurality of known resonant frequencies. The apparatus 300 contemplates an unprogrammed or only semiprogrammed or generally programmed tag 301 on which possibly portions of a plurality of individual resonant circuits have already been provided. For example, the unprogrammed tag 301 can comprise tags similar to the tags 12 or 200 in which only the bottom inductor layer has been provided on a carrier base and an insulating dielectric layer has been provided on top of the inductor layer. In such a structure there is no top capacitive plate and all of the individual circuits are resonant at one or more frequencies which are substantially above any frequencies of interest due to the lack of capacitance.

The apparatus 300 in FIG.14 includes a keyboard 302 by which a user of the apparatus can input a predetermined code which is to be imprinted on the tag 301 by providing on the tag specific resonant frequencies corresponding to this code. The code is essentially provided as an input to a microprocessor controller and memory 303. The memory portion of the controller 303 includes a look up table means which responds to the code input by the keyboard 302 and determines the resonant frequencies to be provided for circuits on the tag 301, along with determining the desired geometry needed for implementing tuned circuits on the tag 301 so that they will have these desired resonant frequencies. This information is then provided by the controller 303 to a printer/controller 304 which is also microprocessor controlled. The controller 304 has a slot 305 in which the unprogrammed tag 301 is to be inserted.

Essentially, the operation of the apparatus 300 is as follows. The tag 301 is provided in the slot 305. A user then uses the keyboard 302 to input a code to be imprinted on the tag 301. The microprocessor controller and memory 303 converts this code into the selection of various tuned frequencies which can be implemented for resonant circuits on the tag 301 and determines the necessary geometry for such resonant circuits. The printer/controller 304 then essentially comprises an adjustment means that is responsive to the output of the table look up means (303) for modifying or otherwise creating a plurality of resonant circuits on the tag to implement coding of the tag in accordance with the predetermined code which was input by the keyboard 302. This operation generally corresponds to the flowchart shown in FIG. 15 which will now be discussed. The flowchart represents the programming of the components 303 and 304.

FIG. 15 shows a flowchart 400 which commences at a step 401 corresponding to typing in a code, such as an 8 digit numerical code, via the keyboard 302. A process step 402 implemented by the controller and memory 303 then determines the frequencies which should then be used for the resonant frequencies for tuned circuits on the tag 301. While step 402 is designated in FIG. 15 as a table look up step, in more general terms this can be viewed as a computation step that determines what resonant frequency circuits are to be implemented on a tag. A process block 403 determines the needed geometries for such resonant circuits, such as the length of inductive spirals and the amount of capacitive plate area needed to create an LC resonant circuit. This dimensional step corresponding to block 403 is also a computation step implemented by the microprocessor controller and memory 303.

The process block 403 in FIG. 15 determines what modifications are needed for any partially formed resonant circuits already provided on the tag 301. These partially formed circuits can comprise portions of a plurality of LC circuits already provided on the tag which now require customization or modification. As indicated in FIG. 15, the process block 403 actually comprises 3 subprocess steps 404 through 406. Step 404 corresponds to determining what additional conductive metalizations may need to be printed on or otherwise added to the tag to implement capacitive type increases, whereas process steps 405 and 406 determine what sort of reductions in either inductance or capacitance should be implemented by either a radial cut (step 405), or a circular cut (step 406). After step 403, control passes to a process block 407 by which the printer/controller 304 implements all of the circuit adjustments requested by the information provided to the controller 304 by the microprocessor controller 303. As indicated in FIG. 15, the step 407 comprises substeps of depositing conductive films and/or implementing radial and/or circular cuts in the tuned circuits to provide the desired customization of the tuned circuits.

Referring to FIG. 16, the operation of the apparatus 300 can best be understood by noting that FIG. 16 illustrates one of several unprogrammed resonant circuits provided on the tag 301. The illustrated resonant circuit consists of a centrally beginning spiral conductor path 410 which spirals outward from a center location 411 and terminates in an end portion 412. Clearly this will implement an inductance and this inductance will be part of a resonant circuit. The metalization 410 is contemplated as being covered by an insulating dielectric layer having a central through hole at the location 411. This dielectric layer is not shown in FIG.16. On top of this insulating dielectric layer a radial sector capacitive metalization 413 is provided having a conductive feed through connection to the metalization 410 at the location 411. Preferably the resonant frequency of such a structure will be in the middle of the selection of possible resonant frequencies for each of the tuned circuits to be provided on the tag 301.

In response to the user specifying a desired code via the keyboard 302, the controller and memory 303 knows what resonant frequencies should be provided on the tag 301 and knows what the geometry of those resonant circuits should be. This information is stored in a look up table in the controller 303. The controller 303 knows what resonant frequencies must be provided for each tuned circuit on the tag 301 to implement the specified code. The controller 303 also knows the resonant frequency and geometry of the circuit structure shown in FIG. 16 which is already on the tag 301 and it will calculate how to modify that circuit geometry to obtain the various different resonant frequency circuit corresponding to the code input by the keyboard 302. The printer/controller 304 will then implement changes to a plurality of resonant circuits having the structure shown in FIG. 16.

One change possible by the printer/controller 304 will be to increase the capacitance of the nominal resonant circuit structure shown in FIG.16. This could readily be achieved merely by increasing the area of the metalization 413 such as by printing an additional area 414, as shown in FIG. 16, by using a fast drying conductive ink. This additional area 414, shown dashed in FIG. 16, would be on top of the non-illustrated dielectric layer and would be electrically connected to the metalization layer 413. This involves the selective adding of metalization to the resonant circuit to alter its resonant frequency by adding capacitance in accordance with instructions received from the microprocessor controller and memory 303.

Another alternative for adjusting tuned circuit frequency is to selectively remove metalizations from circuits on the tag 301 so as to adjust the frequency of the resonant circuits in accordance with the output of the microprocessor controller and memory 303. This could be readily implemented by the printer/controller 304 by utilizing laser trimming techniques, sand abrasive techniques, metal cutting techniques or circuit board punching techniques for disconnecting metalizations. For example, if it is desired to remove a certain amount of inductance and capacitance from a resonant circuit to change its resonant frequency, the printer/controller 304 can implement a radial cut shown by the line 415 in FIG. 16. This will eliminate the inductance provided by the end portion of the metalization 410 and any capacitance associated with the overlapping of this end portion and the printed capacitor metalizations 413 and/or 414. The microprocessor controller 303 will know how much inductance and associated capacitance will be removed in order to achieve a specific desired frequency and therefore this represents merely a table look up function and control function for the controller 303. It should be noted that it is possible to implement a radial cut, such as the cut 415, while also possibly adding additional metalization to increase and thereby adjust the capacitance of the remaining circuit configuration. The printer/controller 304 can implement both of these functions in a proper desired sequence. By radial cut what is meant is a cut directed radially with respect to the central location 411 which defines the center of an outward spiral of inductance metalization forming an inductor of the resonant circuit.

Another possible way of removing metalization effectively from a resonant circuit on the tag 301 to alter its resonant frequency is to implement a circular cut such as indicated in dashed form in FIG. 16 by an annular ring cut 416. Again this cut can be implemented by standard techniques such a laser trimming or grinding which will be controlled automatically by the printer/-controller 304. For such a circular cut, the inductance for the resonant circuit on the tag is still preferably contemplated as being provided in the form of a spiral conductor with the circular cut 416 being centered at the origin of the spiral conductor.

In essence, the apparatus 300 shown in FIG. 14, along with the flowchart 400 shown in FIG. 15, allows the field programming or customization of tuned circuits for RF tagging purposes. This is implemented by selective adding of metalization to the tuned circuits such as by applying a fast drying conductive ink to certain portions of the circuit to increase its capacitance and/or inductance. The amount of inductance/capacitance to be added or subtracted to customize and thereby code a tag is determined by a computer (303) which essentially performs a look-up and calculation function to determine how best to modify an existing portion of a tuned circuit so as to achieve the desired resonant frequency coding of an RF tag. This type of feature is desired in most coding applications since the exact code to be used on the tag may not be known until just before the tag is to be applied to the end product. Such would be the case for adding route coding tags to airline baggage or the like.

To implement the apparatus 300, the microprocessor controller 303 just needs to know what resonant frequencies need to be provided for circuits on the tag 301 to implement the code. The controller 303 will know the nominal resonant frequencies of the unprogrammed circuits on the tag, and therefore it can calculate what circuit geometry changes should be implemented, by the use of numerically controlled printing and trimming apparatus such as the controller 304, to implement these changes. By using numerically controlled printing nozzle or stencil openings and adjusting the positions of the tuned circuits with respect to a print or laser trim mechanism, the device 304 can readily function as desired. In fact, field programmable bar code printers are already available to print a custom bar code in response to a keyboard inputted code, and controller 304 is used to expand this type of control to printing/implementing custom resonant circuits.

While we have shown and described specific embodiments of this invention, further modifications and improvements will occur to those skilled in the art. For example, while flat, spiral configurations for inductors are described herein, other configurations are possible. Also, while the RF tags described here are usable for baggage labels and inventory control, such tags could also be used in connection with postal zip code tagging, ID bracelets for hospital patients, transit fare code tags and/or other code reading applications. Also, broadband white noise RF energy (instead of RF energy due to radiation of a plurality of different oscillator signals) could be simultaneously radiated into the detection zone 14 at at least each of the possible resonant circuit frequencies, and absorption of the radiated energy at each of the resonant frequencies of circuits on a tag could be detected (by receivers operative during and/or after the white noise radiation) to determine one of a plurality of possible codes associated with the tag. All such modifications which retain the basic underlying principles disclosed and claimed herein are within the scope of this invention.

We claim:

1. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of plurality of possible code signals, indicative of which of said resonant frequencies for said passive resonant circuits were detected in said detection zone;

wherein said detection means comprises means for producing a plurality of different oscillator signals, one at each of said plurality of known resonant frequencies, means for simultaneously radiating each of said different frequency oscillator signals in said detection zone, and means for providing said one code signal by measuring signals indicative of absorption of radiated energy at each one of said known resonant frequencies in said detection zone by said passive resonant circuits on said tag, said absorption occurring during said simultaneous radiation of each of said different frequency oscillator signals.

2. RF tagging system according to claim 1 wherein said code signal providing means measures said measured signals during said simultaneous radiation of each of said different frequency oscillator signals.

3. RF tagging system according to claim 2 wherein said measured signals indicative of absorption of radiated energy are provided by measuring magnitudes of said different frequency oscillator signals which are radiated.

4. RF tagging system according to claim 3 wherein said detection means includes means for comparing said measured signals provided by measuring said radiated signal magnitudes when said tag is in said detection zone to signals indicative of the magnitudes of said radiated signals when said tag is outside said detection zone.

5. RF tagging system according to 4 wherein said measured signals are measured when said tag is in said detection zone and said radiated signals are provided with a first phase shift, and said measured signals are also provided when said tag is in said detection zone and said radiated signals are provided with a second and different phase shift, detection of whether one of said resonant circuits in said detection zone is resonant at one of said plurality of known resonant frequencies being dependent on absorption of radiant energy which occurs when said signals are radiated with any of said first and second phase shifts.

6. RF tagging system according to claim 4 wherein said detection means includes receiver antenna means for detecting radiant energy at any of said known resonant frequencies in said detection zone and separate transmitter antennas for radiating said different frequency oscillator signals in said detection zone, and wherein said code signal providing means includes means for measuring signals received at said receiver antennas indicative of energy in said detection zone at any of said known resonant frequencies when said tag is inside said detection zone.

7. RF tagging system according to claim 6 wherein said code signal providing means includes means for also measuring signals received at said receiver antennas when said tag is outside said detection zone and comparing these signals to said signals received by said receiver antenna means when said tag is in said inside said detection zone.

8. RF tagging system according to claim 2 wherein said code signal providing means includes means for measuring both voltage and current of each of said different frequency oscillator signals to be radiated so as to measure energy of said radiated signals, and wherein said measured energy of said different frequency radiated oscillator signals is measured when said tag is inside and outside said detection zone, said code signal providing means including means for comparing said measured voltage and current signals when said tag is inside said detection zone with said measured voltage and current signals measured when said tag is outside of said detection zone to indicate the presence of resonant circuits on said tag at any of said predetermined plurality of known frequencies.

9. RF tagging system according to claim 2 wherein said detection means includes receiver antenna means for detecting radiant energy at any of said known resonant frequencies in said detection zone and separate transmitter antennas for radiating said different frequency oscillator signals in said detection zone, and wherein said code signal providing means includes means for measuring signals received at said receiver antennas indicative of energy in said detection zone at any of said known resonant frequencies when said tag is inside said detection zone and during said simultaneous radiation of said oscillator signals.

10. RF tagging system according to claim 9 wherein said code signal providing means includes means for also measuring signals received at said receiver antennas when said tag is outside said detection zone and comparing these signals to said signals received by said receiver antenna means when said tag is in said inside said detection zone.

11. RF tagging system according to claim 1 wherein said detection means includes sensor means, for detecting when objects having any number of said resonant circuits, including zero, are provided inside said detection zone and when no such objects are provided inside said detection zone.

12. RF tagging system according to claim 11 wherein said sensor means comprises an IR presence detection sensor.

13. RF tagging system according to claim 1 wherein said detection means includes means for sensing an object having any number of said resonant circuits, including zero, approaching said detection zone.

14. RF tagging system according to claim 13 wherein said code signal providing means includes means for storing a no load reference value of said measured signals in response to determining the approach of an object to said detection zone by said object approaching sensing means and utilizing said stored signals for comparison with said measured signals measured in response to detecting positioning of said object in said detection zone.

15. RF tagging system according to 1 wherein said measured signals are measured when said tag is in said detection zone and said radiated signals are provided with a first phase shift, and said measured signals are also provided when said tag is in said detection zone and said radiated signals are provided with a second and different phase shift, detection of whether one of said resonant circuits in said detection zone is resonant at one of said plurality of known resonant frequencies being dependent on absorption of radiant energy which occurs when said signals are radiated with any of said first and second phase shifts.

16. RF tagging system according to claim 1 wherein said code signal providing means includes means for measuring both voltage and current of each of said different frequency oscillator signals to be radiated so as to measure energy of said radiated signals, and wherein said measured energy of said different frequency radiated oscillator signals is measured when said tag is inside and outside said detection zone, said code signal providing means including means for comparing said measured voltage and current signals when said tag is inside said detection zone with said measured voltage and current signals measured when said tag is outside of said detection zone to indicate the presence of resonant circuits on said tag at any of said predetermined plurality of known frequencies.

17. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of a plurality of possible code signals, indicative of which of said resonant frequencies for said passive resonant circuits were detected in said detection zone;

wherein said detection means comprises means for producing a plurality of different oscillator signals, one at each of said plurality of known resonant frequencies, means for radiating each of said different frequency oscillator signals in said detection zone, and means for providing said one code signal by measuring signals indicative of absorption of radiated energy at each one of said known resonant frequencies in said detection zone by said passive resonant circuits on said tag, said absorption occurring during said radiation of each of said different frequency oscillator signals, wherein said measured signals are provided when said tag is in said detection zone and said radiated signals are provided with a first phase shift, and said measured signals are also provided when said tag is in said detection zone and said radiated signals are provided with a second and different phase shift, detection of whether one of said resonant circuits in said detection zone is resonant at one of said plurality of known resonant frequencies being dependent on absorption of radiant energy which occurs when said signals are radiated with any of said first and second phase shifts.

18. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of a plurality of possible code signals, indicative of which of said resonant frequencies for said passive resonant circuits were detected in said detection zone;

wherein said detection means comprises means for producing a plurality of different oscillator signals, one at each one of said plurality of known resonant frequencies, means for radiating each of said different frequency oscillator signals in said detection zone, and means for providing said one code signal by measuring signals indicative of absorption of radiated energy at each one of said known resonant frequencies in said detection zone by said passive resonant circuits on said tag, said absorption occurring during said radiation of each of said different frequency oscillator signals, wherein said measured signals are provided when said tag is in said detection zone and said radiated signals are provided with a first polarization, and said measured signals are also provided when said tag is in said detection zone and said radiated signals are provided with a second and different polarization, detection of whether one of said resonant circuits in said detection zone is resonant at one of said plurality of known resonant frequencies being dependent on absorption of radiant energy which occurs when said signals are radiated with any of said first and second polarizations.

19. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of plurality of possible code signals, indicative of which of said resonant frequencies for said passive resonant circuits were detected in said detection zone;

wherein said detection means comprises means for producing a plurality of different oscillator signals, one at each of said plurality of known resonant frequencies, means for radiating each of said different frequency oscillator signals in said detection zone, and means for providing said one code signal by measuring signals indicative of absorption of radiated energy at each one of said known resonant frequencies in said detection zone by said passive resonant circuits on said tag, said absorption occurring during said radiation of each of said different frequency oscillator signals, wherein said measured signals are provided when said tag is in said detection zone and said radiated signals are provided with a first phase shift and a first polarization, and said measured signals are also provided when said tag is in said detection zone and said radiated signals are provided with a second and different phase shift and a second and different polarization, detection of whether one of said resonant circuits in said detection zone is resonant at one of said plurality of known resonant frequencies being dependent on absorption of radiant energy which occurs when said signals are radiated with any of said first and second phase shifts and polarizations.

20. RF tagging system comprising:

a tag having thereon a plurality of passive resonant circuits, each of said passive resonant circuits resonant at a different resonant frequency selected from a predetermined plurality of resonant frequencies:

means for detecting said plurality of passive resonant circuits on said tag, when said tag is in a detection zone, and then providing a corresponding code signal, out of a plurality of possible code signals, indicative of which of said resonant frequencies for said passive resonant circuits were detected in said detection zone;

wherein said detection means comprises means for producing a plurality of different oscillator signals, one at each of said plurality of known resonant frequencies, means for radiating each of said different frequency oscillator signals in said detection zone, and means for providing said one code signal by measuring signals indicative of absorption of radiated energy at each one of said known resonant frequencies in said detection zone by said passive resonant circuits on said tag, said absorption occurring during said radiation of each of said different frequency oscillator signals, wherein said code signal providing means includes means for measuring both voltage and current of each of said different frequency oscillator signals so as to measure energy and wherein said measured energy of said different frequency oscillator signals is measured when said tag is inside and outside said detection zone, said code signal providing means including means for comparing said measured voltage and current signals when said tag is inside said detection zone with said measured voltage and current signals measured when said tag is outside of said detection zone to indicate the presence of resonant circuits on said tag at any of said predetermined plurality of known frequencies.

21. RF tagging system comprising:

a tag having thereon a plurality of passive resonant circuits, each of said circuits resonant at a resonant frequency selected from a predetermined plurality of known resonant frequencies; and means for detecting said plurality of passive resonant circuits on said tag, when said tag is in a detection zone, and then providing a corresponding code signal, out of a plurality of possible code signals, indicative of which of said resonant frequencies for said passive resonant circuits were detected as being in said detection zone;

wherein each of said plurality of resonant circuits on said tag comprises a first metalization area determining an inductance and a second metalization area determining a capacitance for said resonant circuit, said second metalization area defining a capacitor plate having a plurality of planar capacitive metalization projections each connected to one another by a thin conductor runner, whereby step adjustment of the resonant frequency of the resonant circuit is readily achieved by removing one or more of said conductor runners either during initial manufacture or subsequently.

22. RF tagging system according to claim 21 wherein said plurality of capacitive metalization projections all are disposed about and extend generally inward toward a central location with said runners disposed away from and outward with respect to said central location.

23. RF tag comprising:

a tag base having thereon a plurality of passive resonant circuits, each of said circuits resonant at a resonant frequency selected from a predetermined plurality of known resonant frequencies;

wherein each of said plurality of resonant circuits on said tag base comprises a first metalization area determining an inductance and a second metalization area determining a capacitance for said resonant circuit, said second metalization area defining a capacitor plate having a plurality of planar capacitive metalization projections each connected to one another by a thin conductor runner, whereby step adjustment of the resonant frequency of the resonant circuit is readily achieved by removing one or more of said conductor runners either during initial manufacture or subsequently.

24. RF tag according to claim 23 wherein said plurality of capacitive metalization projections all are disposed about and extend generally inward toward a central location with said runners disposed away from and outward with respect to said central location.

25. RF tag comprising:

a tag base having thereon a plurality of passive resonant circuits, each of said circuits resonant at a resonant frequency selected from a predetermined plurality of known resonant frequencies;

wherein each of said plurality of resonant circuits on said tag base comprises a first metalization area, having a boundary, determining an inductance, an insulating layer provide on and covering at least a portion of said first metalization area, and a second metalization area provided on said insulating layer and determining a capacitance for said resonant circuit due to overlap with said first metalization area, said second metalization area defining a capacitor plate having a plurality of planar capacitive metalization projections on said insulating layer and positioned above and horizontally overlapping said first metalization area, each of said capacitive metalization projections connected to one another by a thin conductor runner, said runners positioned beyond the boundary of said first metalization area and not overlapping said first metalization area, whereby step adjustment of the resonant frequency of the resonant circuit is readily achieved by removing one or more of said conductor runners either during initial manufacture or subsequently.

26. RF tag according to claim 25 wherein said plurality of capacitive metalization projections all are disposed about and extend generally inward toward a central location with said runners disposed away from and outward with respect to said central location.

27. RF tagging system comprising:

a tag having thereon a plurality of passive resonant circuits, each of said circuits resonant at a frequency selected from a predetermined plurality of known resonant frequencies, each of said resonant circuits provided at a different location on a planar surface of said tag;

means for detecting said plurality of passive resonant circuits on said tag when said tag is in a detection zone, and then providing a corresponding code signal out of a plurality of possible code signals indicative of which of said resonant frequencies for said passive resonant circuits were detected as being in said detection zone;

wherein said detection means includes at least one antenna for radiating each of said plurality of known resonant frequencies, said antenna constructed to provide a narrow focused radiation beam in said detection zone having a focus area of a size X on said tag planar surface, and wherein each of said resonant circuits provided on said tag planar surface has an area of no more than X, and wherein only one of said resonant circuits is provided in the focus area X at any one time.

28. RF tagging system according to claim 27 which includes a plurality of said focused beam antennas each of which is fixed in position with respect to others of said focused beam antennas and each of which radiates each of said predetermined plurality of known resonant frequencies, said plurality of focused beam antennas forming an antenna array.

29. RF tagging system according to claim 28 wherein for each of said resonant circuits on said tag a different one of said focused beam antennas is provided.

30. RF tagging system comprising:

a tag having thereon a plurality of passive resonant circuits, each of said passive resonant circuits resonant at a resonant frequency selected from a predetermined plurality of known resonant frequencies;

means for detecting said plurality of passive resonant circuits on said tag, when said tag is in a detection zone, and then providing a corresponding code signal, out of a plurality of possible code signals, indicative of which of said resonant frequencies for said passive resonant circuits were detected in said detection zone;

wherein said detection means comprises means for producing a plurality of different oscillator signals at each one of said plurality of known resonant frequencies, means for radiating each of said different frequency oscillator signals in said detection zone, and means for providing said one code signal by measuring signals indicative of absorption of radiated energy at each one of said known resonant frequencies in said detection zone by said passive resonant circuits on said tag, said absorption occurring during said radiation of each of said different frequency oscillator signals, wherein said detection means includes means for sensing an object having any number of said resonant circuits, including zero, approaching said detection zone, and wherein said code signal providing means includes means for storing a no load reference value of said measured signals in response to determining the approach of an object to said detection zone by said object approaching sensing means and utilizing said stored signals for comparison with said measured signals measured in response to detecting positioning of said object in said detection zone.

31. RF tag comprising:

a tag base having thereon a plurality of passive resonant circuits, each of said circuits resonant at a resonant frequency selected from a predetermined plurality of known resonant frequencies;

wherein each of said plurality of resonant circuits on said tag base comprises at least a first metalization area determining at least one of an inductance and capacitance for each of said resonant circuits, said first metalization area formed of printed conductive ink provided on said base.

32. RF tag according to claim 31 wherein each of said plurality of resonant circuits also includes a printed nonconductive ink deposited on said first metalization area and a printed second metalization area, formed of conductive ink, deposited on said nonconductive ink, said first and second metalization areas determining said inductance and capacitance for said resonant circuit.

33. RF tag according to claim 32 wherein said nonconductive ink is provided in a pattern with a hole therein, and a conductive feedthrough between said first and second metalization areas is provided in said hole.

34. A method for providing an RF tag comprising the steps of;

providing a tag base which will have thereon a plurality of passive resonant circuits, each of said circuits resonant at a resonant frequency selected from a predetermined plurality of known resonant frequencies; and printing with conductive ink on said base at least a first metalization area for each of said plurality of resonant circuits to be provided on said tag base, said first metalization area determining at least one of an inductance and capacitance for each of said resonant circuits.

35. A method according to claim 34 which includes the step of printing a nonconductive ink on said first metalization area and printing a second metalization area, formed of conductive ink, on said nonconductive ink, said first and second metalization areas determining said inductance and capacitance for each of said resonant circuits.

36. A method according to claim 35 wherein said step of printing said nonconductive ink comprises printing said nonconductive ink in a pattern with a hole therein and wherein said method includes the step of providing a conductive feedthrough between said first and second metalization areas through said hole in said nonconductive ink pattern.

37. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of plurality of possible code signals, indicative of which of said resonant frequencies for said passive resonant circuits were detected in said detection zone;

wherein said detection means comprises means for simultaneously radiating RF energy at least each of said predetermined plurality of known resonant frequencies in said detection zone, and means for providing said one code signal by measuring signals indicative of absorption of said radiated energy at each one of said known resonant frequencies in said detection zone by said passive resonant circuits on said tag.

38. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of a plurality of possible code signals, indicative of which of said resonant frequencies for said passive resonant circuits were detected in said detection zone;

wherein said detection means comprises means for radiating RF energy at at least each of said predetermined plurality of known resonant frequencies in said detection zone, and means for providing said one code signal by measuring signals indicative of absorption of said radiated energy at each one of said known resonant frequencies in said detection zone by said passive resonant circuits on said tag, wherein said measured signals are provided when said tag is in said detection zone and said radiated energy is provided with a first phase shift, and said measured signals are also provided when said tag is in said detection zone and said radiated energy is provided with a second and different phase shift, detection of whether one of said resonant circuits in said detection zone is resonant at one of said plurality of known resonant frequencies being dependent on absorption of radiant energy which occurs when said RF energy is radiated with any of said first and second phase shifts.

39. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of a plurality of possible code signals, indicative of which of said resonant frequencies for said passive resonant circuits were detected in said detection zone;

wherein said detection means comprises means for radiating RF energy at at least each of said predetermined plurality of known resonant frequencies in said detection zone, and means for providing said one code signal by measuring signals indicative of absorption of said radiated energy at each one of said known resonant frequencies in said detection zone by said passive resonant circuits on said tag, wherein said measured signals are provided when said tag is in said detection zone and said radiated energy is provided with a first polarization, and said measured signals are also provided when said tag is in said detection zone and said radiated energy is provided with a second and different polarization, detection of whether one of said resonant circuits in said detection zone is resonant at one of said plurality of known resonant frequencies being dependent on absorption of radiant energy which occurs when said RF energy is radiated with any of said first and second polarizations.

40. RF tagging system comprising:

a tag having thereon a plurality of passive resonant circuits, each of said passive resonant circuits resonant at a different resonant frequency selected from a predetermined plurality of known resonant frequencies;

means for detecting said plurality of passive resonant circuits on said tag, when said tag is in a detection zone, and then providing a corresponding code signal, out of a plurality of possible code signals, indicative of which of said resonant frequencies for said passive resonant circuits were detected in said detection zone;

wherein said detection means comprises means for radiating RF energy at at least each of said predetermined plurality of known resonant frequencies in said detection zone, and means for providing said one code signal by measuring signals indicative of absorption of radiated energy at each one of said known resonant frequencies in said detection zone by said passive resonant circuits on said tag, wherein said code signal providing means includes means for measuring both voltage and current at each of said predetermined plurality of known resonant frequencies and wherein said measured voltage and current signals are measured when said tag is inside and outside said detection zone, said code signal providing means including means for comparing said measured voltage and current signals when said tag is inside said detection zone with said measured voltage and current signals measured when said tag is outside of said detection zone to indicate the presence of resonant circuits on said tag at any of said predetermined plurality of known frequencies.

41. RF tagging system comprising:

a tag having thereon a plurality of passive resonant circuits, each of said passive resonant circuits resonant at a resonant frequency selected from a predetermined plurality of known resonant frequencies;

means for detecting said plurality of passive resonant circuits on said tag, when said tag is in a detection zone, and then providing a corresponding code signal, out of plurality of possible code signals, indicative of which of said resonant frequencies for said passive resonant circuits were detected in said detection zone;

wherein said detection means comprises means for radiating RF energy at at least each of said predetermined plurality of known resonant frequencies in said detection zone, and means for providing said one code signal by measuring signals indicative of absorption of radiated energy at each one of said known resonant frequencies in said detection zone by said passive resonant circuits on said tag, wherein said detection means includes means for sensing an object having any number of said resonant circuits, including zero, approaching said detection zone, and wherein said code signal providing means includes means for storing a no load reference value of said measured signals in response to determining the approach of an object to said detection zone by said object approaching sensing means and utilizing said stored signals for comparison with said measured signals measured in response to detecting positioning of said object in said detection zone.

* * * * *

UNITED STATES PATENT AND TRADEMARK OFFICE

CERTIFICATE OF CORRECTION

PATENT NO. : 5,381,137

DATED : January 10, 1995

INVENTOR(S) : Sanjar Ghaem, Rudyard L. Istvan, George L. Lauro

It is certified that error appears in the above-indentified patent and that said Letters Patent is hereby corrected as shown below:

Claim 18, Col. 23, Line 28, after "each" delete "one".

Signed and Sealed this

Twentieth Day of February, 1996

Attest:

Bruce Lehman

BRUCE LEHMAN

*Attesting Officer*

*Commissioner of Patents and Trademarks*